(12) United States Patent
Takei et al.

(10) Patent No.: US 7,226,721 B2
(45) Date of Patent: Jun. 5, 2007

(54) UNDERLAYER COATING FORMING COMPOSITION FOR LITHOGRAPHY CONTAINING COMPOUND HAVING PROTECTED CARBOXYL GROUP

(75) Inventors: Satoshi Takei, Toyama (JP); Takahiro Kishioka, Toyama (JP); Yasushi Sakaida, Toyama (JP); Tetsuya Shinjo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/565,968

(22) PCT Filed: Jul. 30, 2004

(86) PCT No.: PCT/JP2004/010939

§ 371 (c)(1),
(2), (4) Date: Jan. 31, 2006

(87) PCT Pub. No.: WO2005/013601

PCT Pub. Date: Feb. 10, 2005

(65) Prior Publication Data

US 2006/0210915 A1 Sep. 21, 2006

(30) Foreign Application Priority Data

Jul. 30, 2003 (JP) .............................. 2003-282738
Oct. 3, 2003 (JP) .............................. 2003-345476

(51) Int. Cl.
*G03F 7/11* (2006.01)
*G03C 5/00* (2006.01)

(52) U.S. Cl. ..................... 430/271.1; 430/326; 430/905

(58) Field of Classification Search ..................... None
See application file for complete search history.

(56) References Cited

U.S. PATENT DOCUMENTS

| | | | |
|---|---|---|---|
| 5,693,691 A | 12/1997 | Flaim et al. | |
| 5,919,599 A | 7/1999 | Meador et al. | |
| 6,686,124 B1 | 2/2004 | Angelopoulos et al. | |
| 2002/0090452 A1 | 7/2002 | Hong et al. | |
| 2002/0093069 A1 | 7/2002 | Hong et al. | |
| 2002/0123586 A1 | 9/2002 | Hong et al. | |
| 2002/0127789 A1 | 9/2002 | Hong et al. | |

FOREIGN PATENT DOCUMENTS

| | | |
|---|---|---|
| JP | A-10-221855 | 8/1998 |
| JP | A-2000-264921 | 9/2000 |
| JP | A-2000-294504 | 10/2000 |
| JP | A-2002-47430 | 2/2002 |
| JP | A-2002-72488 | 3/2002 |
| JP | A-2002-80537 | 3/2002 |
| JP | A-2002-97231 | 4/2002 |
| JP | A-2002-105137 | 4/2002 |
| JP | A-2002-190519 | 7/2002 |
| WO | WO 02/05035 | 1/2002 |

OTHER PUBLICATIONS

Lynch, Tom et al., "Properties and Performance of Near UV Reflectivity Control Layers", US, in Advances in Resist Technology and Proceedings XI, Omkaram Nalamasu et., Proceedings of SPIE, 1994, vol. 2195, pp. 225-229.

Taylor, G. et al., " Methacrylate Resists and Antireflective Coatings for 193 nm Lithography", US, in Microlithography 1999: in Advances in Resist Technology and Processing XVI, Will Conley ed., Proceedings of SPIE, 1999, vol. 3678, pp. 174-185.

Meador, Jim D. et al., "Recent Progress in 193 nm Antireflective Coatings", US in Microlithography 1999: in Advances in Resist Technology and Processing XVI, Will Conley ed., Proceedings of SPIE, 1999, vol. 3678, pp. 800-809.

*Primary Examiner*—Rosemary Ashton
(74) *Attorney, Agent, or Firm*—Oliff & Berridge, PLC

(57) ABSTRACT

There is provided an underlayer coating forming composition for lithography, and an underlayer coating having a high dry etching rate compared with photoresist, and causing no intermixing with the photoresist, which are used in lithography process of manufacture of semiconductor device. Concretely, it is an underlayer coating forming composition comprising a compound having a protected carboxyl group, a compound having a group capable of reacting with a carboxyl group and a solvent, and an underlayer coating forming composition comprising a compound having a group capable of reacting with a carboxyl group and a protected carboxyl group and a solvent.

15 Claims, 1 Drawing Sheet

UNDERLAYER COATING FORMING COMPOSITION FOR LITHOGRAPHY CONTAINING COMPOUND HAVING PROTECTED CARBOXYL GROUP

TECHNICAL FIELD

The present invention relates to a novel composition for forming underlayer coating for lithography, an underlayer coating formed from the composition and a method for forming photoresist pattern by use of the underlayer coating. In addition, the present invention relates to an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; an underlayer coating forming composition for forming the underlayer coating, and a method for forming the underlayer coating. Further, the present invention relates to a composition for forming underlayer coating for lithography that can be used for filling holes formed on a semiconductor substrate.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective film, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of a substrate have become serious problems. Accordingly, it has been widely studied to provide an anti-reflective coating between the photoresist and the substrate (Bottom Anti-Reflective Coating, BARC) in order to resolve the problem. As the anti-reflective coating, from a viewpoint of easy of use,; many considerations have been done on organic anti-reflective coatings made of a light absorbing substance and a polymer compound and the like. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example Patent Documents 1 and 2).

The physical properties desired for organic anti-reflective coating include high absorbance to light and radioactive rays, no intermixing with the photoresist layer (being insoluble in photoresist solvents), no diffusion of low molecular substances from the ant-reflective coating into the topcoat photoresist upon baking under heating, and a higher dry etching rate than the photoresist (see, for example, Non-patent Documents 1, 2 and 3).

In recent years, in order to solve interconnection delay that has become clear with miniaturization in pattern rule of semiconductor devices, it has been considered to use copper as interconnect material, and to apply Dual Damascene process as interconnect forming method on the semiconductor device. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like.

However, it is difficult to apply organic material for anti-reflective coating on a substrate having a high aspect ratio, and in recent years, material with particular emphasis on filling property or flattening property has been developed (see, for example Patent Documents 3, 4, 5 and 6).

In addition, in the production of devices such as semiconductors, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example Patent Document 7).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist.

As the underlayer coating is required to cause no intermixing, a crosslinking reaction is utilized for the formation of the underlayer coating in many cases. And, as the composition for forming such a crosslinkable underlayer coating, a composition comprising a polymer, a crosslinking agent and a sulfonic acid compound as a crosslinking catalyst is used (see, for example Patent Documents 1, 3, 4 and 6). However, as the compositions contain a strong acid being the sulfonic acid compound, they are anticipated to have a problem in shelf stability.

Therefore, an underlayer coating formed by use of crosslinking reaction for which no strong acid catalyst is required, and a composition therefor have been desired.

In the meanwhile, there are known compositions for anti-reflective coating that are anticipated to utilize crosslinking system in which no strong acid catalyst is required (see, for example Patent Documents 8, 9, 10 and 11).

Patent Document 1: U.S. Pat. No. 5,919,599
Patent Document 2: U.S. Pat. No. 5,693,691
Patent Document 3: JP-A-2000-294504 (2000)
Patent Document 4: JP-A-2002-47430 (2002)
Patent Document 5: JP-A-2002-190519 (2002)
Patent Document 6: WO 02/05035 pamphlet
Patent Document 7: JP-A-2002-128847 (2002)
Patent Document 8: U.S. Pat. No. 6,686,124
Patent Document 9: JP-A-2001-192411 (2001)
Patent Document 10: JP-A-2000-264921 (2000)
Patent Document 11: JP-A-7-316268 (1995)
Non-patent Document 1: Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225–229

Non-patent Document 2: G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174–185

Non-patent Document 3: Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800–809

DISCLOSURE OF INVENTION

Problem to be Solved by the Invention

An object of the present invention is to provide a composition for forming underlayer coating for lithography that can be used for the production of semiconductor devices, and to provide an underlayer coating for lithography that causes no intermixing with a photoresist applied and formed as an upper layer and that has a high dry etching rate compared with the photoresist, and an underlayer coating forming composition for lithography for forming the underlayer coating. Further, another object of the present invention is to provide an underlayer coating formed by use of crosslinking reaction for which no strong acid catalyst is required, a method for forming the underlayer coating and an underlayer coating forming composition for lithography therefor.

Further, an object of the present invention is to provide an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating; a composition for forming the underlayer coating. And another object of the present invention is to provide a method for forming underlayer coating for lithography by use of the underlayer coating forming composition, and a method for forming a photoresist pattern.

Means for Solving the Problem

Taking the abovementioned present status into account, the present inventors eagerly investigated, and as a result of it, they found the use of a compound having a protected carboxyl group and a compound having a group capable of reacting with a carboxyl group, or the use of a compound having a protected carboxyl group and a group capable of reacting with a carboxyl group makes possible to form an underlayer coating, and they completed the present invention.

The present invention relates to the following aspects:

as a first aspect, an underlayer coating forming composition for lithography comprising a compound having a protected carboxyl group of formula (1):

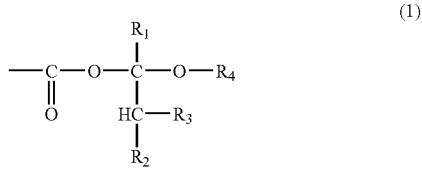

wherein $R_1$, $R_2$ and $R_3$ are independently of one another, hydrogen atom or $C_{1-10}$alkyl group, $R_4$ is $C_{1-10}$alkyl group, or $R_3$ and $R_4$ together may form a ring, a compound having a group capable of reacting with a carboxyl group, and a solvent;

as a second aspect, an underlayer coating forming composition for lithography comprising a compound having a group capable of reacting with a carboxyl group, and a protected carboxyl group of formula (1) wherein $R_1$, $R_2$, $R_3$ and $R_4$ have the same meaning as that defined in the first aspect, and a solvent;

as a third aspect, the underlayer coating forming composition for lithography as described in the first or two aspect, wherein the group capable of reacting with a carboxyl group is a group selected from the group consisting of an epoxy group, an oxetanyl group, an oxazoline group, a cyclocarbonate group, an alkoxysilyl group, an aminomethylol group, an aziridinyl group, a methylol group, a hydroxy group, an isocyanate group, an alkoxymethylamino group, and a hydroxysilyl group;

as a fourth aspect, the underlayer coating forming composition for lithography as described in the first aspect, wherein the compound having the protected carboxyl group of formula (1) is a polymer containing a unit structure of formula (2):

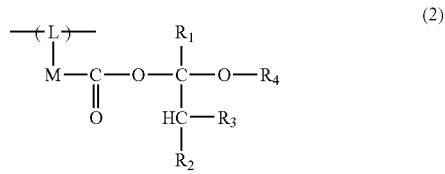

wherein L is a bonding group constituting a main chain of the polymer, and M is a direct bond or a linking group;

as a fifth aspect, the underlayer coating forming composition for lithography as described in the first aspect, wherein the compound having a protected carboxyl group of formula (1) is a compound having at least two protected carboxyl groups of formula (1) and a molecular weight of 200 to 2000;

as a sixth aspect, the underlayer coating forming composition for lithography as described in the first aspect, wherein the compound having a group capable of reacting with a carboxyl group is a compound having at least two groups of formula (3):

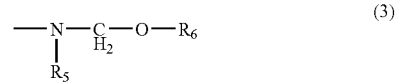

wherein $R_5$ is hydrogen atom, $C_{1-6}$alkyl group or —$CH_2OR_7$ wherein $R_7$ is hydrogen atom or $C_{1-10}$alkyl group, and $R_6$ is hydrogen atom or $C_{1-10}$alkyl group;

as a seventh aspect, the underlayer coating forming composition for lithography as described in the first aspect, wherein the compound having a group capable of reacting with a carboxyl group is a polymer containing at least one unit structure selected from the group consisting of formulae (4), (5), (6), (7), (8) and (9):

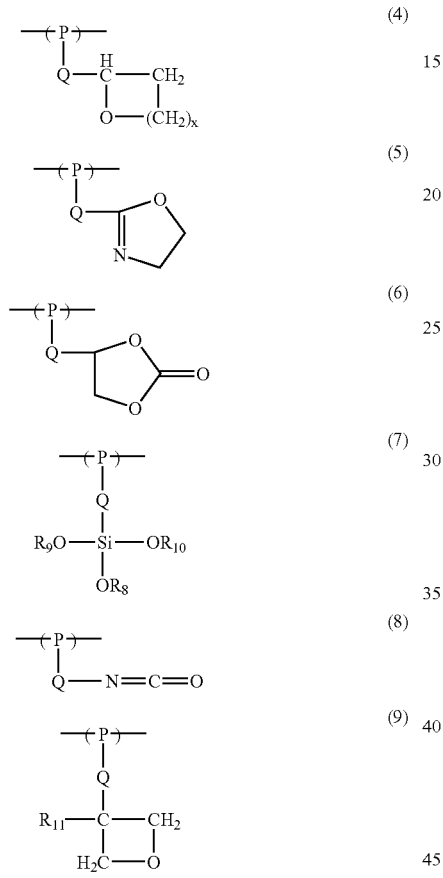

wherein P is a bonding group constituting a main chain of the polymer, Q is a direct bond or a linking group, $R_8$, $R_9$, $R_{10}$ and $R_{11}$ are independently of one another, hydrogen atom or $C_{1-6}$alkyl group, and x is 0 or 1;

as an eighth aspect, the underlayer coating forming composition for lithography as described in the second aspect, wherein the compound having a group capable of reacting with a carboxyl group, and a protected carboxyl group of formula (1) is a polymer containing the unit structure of formula (2) and at least one unit structure selected from the group consisting of formulae (4), (5), (6), (7), (8) and (9);

as a ninth aspect, the underlayer coating forming composition for lithography as described in the second aspect, wherein the compound having a group capable of reacting with a carboxyl group, and a protected carboxyl group of formula (1) is a polymer containing the unit structure of formulae (10) and (11):

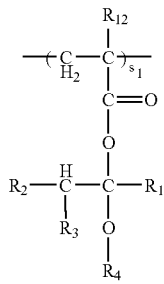

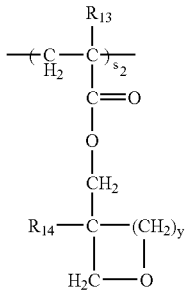

wherein $R_{12}$ and $R_{13}$ are independently of each other hydrogen atom or methyl group, $R_{14}$ is hydrogen atom, methyl group or ethyl group, y is 0 or 1, $s_1$ and $s_2$ are molar ratio of each unit structure constituting the polymer, $s_1$ is 0.05 to 0.95 and $S_2$ is 0.05 to 0.95, with proviso that $0.1 \leq s_1+s_2 \leq 1$;

as a tenth aspect, the underlayer coating forming composition for lithography as described in the second aspect, wherein the compound having a group capable of reacting with a carboxyl group, and a protected carboxyl group of formula (1) is a polymer containing the unit structure of formulae (12), (13) and (14):

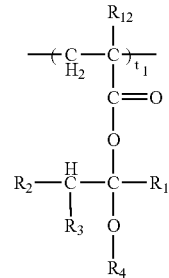

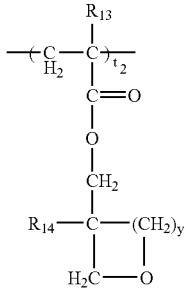

-continued

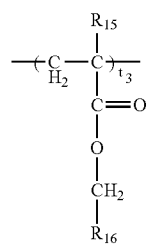
(14)

wherein $R_{12}$, $R_{13}$, and $R_{14}$ have the same meaning as that defined in the ninth aspect, $R_{15}$ is hydrogen atom or methyl group, $R_{16}$ is hydrogen atom, $C_{1-6}$alkyl group, phenyl group, naphthyl group or anthryl group, $t_1$, $t_2$ and $t_3$ are molar ratio of each unit structure constituting the polymer, $t_1$ is 0.05 to 0.90, $t_2$ is 0.05 to 0.90 and $t_3$ is 0.05 to 0.90, with proviso that $0.15 \leq t_1 + t_2 + t_3 \leq 1$;

as an eleventh aspect, the underlayer coating forming composition for lithography as described in any one of the first to tenth aspects, further comprising a light absorbing compound;

as a twelfth aspect, a method for forming an underlayer coating for use in manufacture of semiconductor device, comprising coating the underlayer coating forming composition for lithography as described in any one of the first to eleventh aspects on a substrate and baking it;

as a thirteenth aspect, an underlayer coating obtained by coating the underlayer coating forming composition for lithography as described in any one of the first to eleventh aspects on a substrate and baking it;

as a fourteenth aspect, a method for forming photoresist pattern for use in manufacture of semiconductor device, comprising coating the underlayer coating forming composition for lithography as described in any one of the first to eleventh aspects on a semiconductor substrate, and baking it to form an underlayer coating, forming a photoresist layer on the underlayer coating, exposing the semiconductor substrate covered with the underlayer coating and the photoresist layer to light, and developing the photoresist layer after the exposure to light; and as a fifteenth aspect, the method for forming photoresist pattern as described in the fourteenth aspect, wherein the exposure to light is carried out with a right of a wavelength of 248 nm, 193 nm or 157 nm.

EFFECT OF THE INVENTION

As mentioned above, the present invention relates to an underlayer coating formed by use of crosslinking reaction that dose not require a strong acid catalyst, and an underlayer coating forming composition for lithography for forming the underlayer coating.

The underlayer coating forming composition for lithography of the present Invention contains no strong acid catalyst, and therefore it is excellent in shelf stability.

The system of the underlayer coating forming composition of the present invention in which a crosslinked structure is formed by a reaction of polymers does not contain low molecular weight crosslinking agents nor low molecular weight compounds such as sulfonic acid compound, etc. that have been conventionally used. Therefore, the present invention can reduce sublimation substances produced during baking in its amount, and avoid contamination of semiconductor substrates or clean-room caused by particles or foreign substances derived from the sublimation substances.

The underlayer coating forming composition for lithography of the present invention can attain a high filling property inside holes without occurrence of void (gap). As the composition can fill and flatten unevenness on substrates having holes, the film thickness of photoresists formed thereon can be improved in uniformity. Therefore, good photoresist pattern form can be formed even in the process by use of substrates having holes.

The underlayer coating forming composition for lithography of the present invention can provide an excellent underlayer coating that has a high dry etching rate compared with photoresists, and cause no intermixing with photoresists.

In addition, the underlayer coating of the present invention can be used as an anti-reflective coating, a flattening coating, or a coating for preventing contamination of a photoresist layer. Consequently, the present invention enables the formation of photoresist pattern in lithography process of the production of semiconductor device to be carried out easily and in a high accuracy.

BEST MODE FOR CARRYING OUT THE INVENTION

Figure 1:
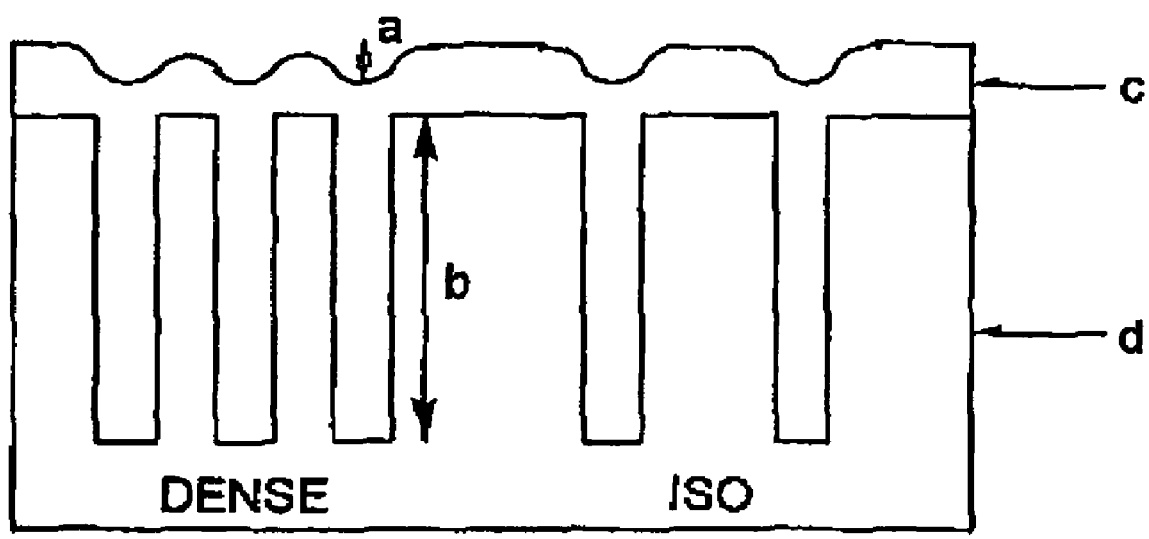
FIG. 1 is a schematic sectional view of an underlayer coating formed on a substrate having holes, in which symbol a is dimple depth of the underlayer coating at the center of the hole, b is depth of initial hole on the substrate used, c is the underlayer coating, and d is the substrate.

The underlayer coating forming composition for lithography of the present invention comprises a compound having a protected carboxyl group of formula (1), a compound having a group capable of reacting with a carboxyl group, and a solvent. In addition, the underlayer coating forming composition for lithography of the present invention comprises a compound having a group capable of reacting with a carboxyl group, and a protected carboxyl group of formula (1), and a solvent. Further, the underlayer coating forming composition of the present invention comprises a light absorbing compound, a surfactant, and the like as arbitrary components.

The proportion of the solid content in the underlayer coating forming composition for lithography of the present invention is not specifically limited so long as each component is homogeneously dissolved, but is for example 0.1 to 70 mass %, or for example 0.5 to 50 mass %, or 1 to 30 mass %, or 5 to 25 mass %. In this specification, the solid content means all components in the underlayer coating forming composition from which the solvent component is excluded. The proportion of the compound having a protected carboxyl group of formula (1) and the compound having a group capable of reacting with a carboxyl group in the solid content is 70 mass % or more, for example 80 to 100 mass %, or 80 to 99 mass %, or 90 to 99 mass % The proportion of the compound having a group capable of reacting with a carboxyl group and a protected carboxyl group of formula (1) in the solid content is 70 mass % or more, for example 80 to 100 mass %, or 80 to 99 mass %, or 90 to 99 mass %.

The underlayer coating forming composition for lithography of the present invention comprises a compound having a protected carboxyl group of formula (1), a compound having a group capable of reacting with a carboxyl group, and a solvent.

$R_1$, $R_2$ and $R_3$ in formula (1) are independently of one another, hydrogen atom or $C_{1-10}$alkyl group, $R_4$ is $C_{1-10}$alkyl group, or $R_3$ and $R_4$ together may form a ring. $C_{1-10}$alkyl group includes methyl group, ethyl group, n-butyl group, n-octyl group, isopropyl group, tert-butyl group, 2-ethylhexyl group, cyclohexyl group, etc. In addition, $R_3$ and $R_4$ together may form a ring, and the ring formed as mentioned above includes tetrahydrofuran, tetrahydropyran, etc.

The compound having a protected carboxyl group of formula (1) can be produced by reacting a compound having a carboxyl group with a vinyl ether compound of formula (15).

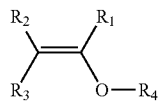
(15)

The reaction of a compound having a carboxyl group with a vinyl ether compound can be conducted by use of phosphoric acid as a catalyst with stirring at room temperature as described in Journal of the Adhesion Society of Japan, Vol. 34, 352–356.

The vinyl ether compound of formula (15) includes for example aliphatic vinyl ether compounds such as methyl vinyl ether, ethyl vinyl ether, isopropyl vinyl ether, n-butyl vinyl ether, 2-ethylhexyl vinyl ether, tert-butyl vinyl ether, and cyclohexyl vinyl ether, etc. and cyclic vinyl ether compounds such as 2,3-dihydrofuran, 4-methyl2,3-dihydrofuran, and 2,3-dihydro-4H-pyran, etc.

The compound having a carboxyl group that is reacted with the vinyl ether compound of formula (15) is not specifically limited so long as it is a compound having a carboxyl group.

The compound having a carboxyl group includes for example benzoic acid, isophthalic acid, terephthalic acid, pyromellitic acid, 1,2,4-trimellitic acid, adipic acid, maleic acid, butanetetracarboxylic acid, tris(2-carboxyethyl)isocyanurate, naphthalene-2-carboxylic acid, naphthalene-2,6-dicarboxylic acid, pamoic acid, pyrene-1-carboxylic acid, 1,6-dibromo-2-hydroxynaphthalene-3-carboxylic acid, 1,1'-binaphthalene-2,2'-dicarboxylic acid, anthracene-9-carboxylic acid, anthracene-9,10-dicarboxylic acid, acrylic acid, methacrylic acid, maleic acid, itaconic acid, glutaric acid, 1,2-cyclohexanedicarboxylic acid, and 1,2,3,4-cyclopentanetetracarboxylic acid, and the like. It is preferable that the compound having a protected carboxyl group of formula (1) produced from these compounds has a molecular weight of 200 or more. In case where the compound has a molecular weight less than the above, it may cause a problem that the compound sublimates during baking for forming the underlayer coating. The molecular weight is for example 200 to 2000, or for example 400 to 2000. The compound having a protected carboxyl group of formula (1) has preferably two or more protected carboxyl groups of formula (1) from the standpoint of formation of tough underlayers.

The compound having a carboxyl group to be reacted with the vinyl ether compound of formula (15) includes also polymers having a carboxyl group. Such polymers are not specifically limited, and for example include polymers containing as unit structure an addition polymerizable monomer such as acrylic acid, methacrylic acid, vinyl benzoic acid and maleic acid, etc.

In the present invention, the compound having a protected carboxyl group of formula (1) includes also polymers having a unit structure of formula (2). In the formula, L is a bonding group constituting a main chain of the polymer, and M is a direct bond or a linking group. L is not specifically limited so long as it is a bonding group constituting a main chain of the polymer. M includes a linking group or a direct bond containing at least one linking group selected from phenylene group, —C(=O)—, —CH$_2$—, —NH— and —O—.

The unit structure of formula (2) includes for example the structure of formulae (16) to (20).

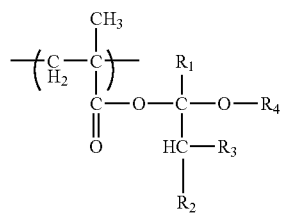
(16)

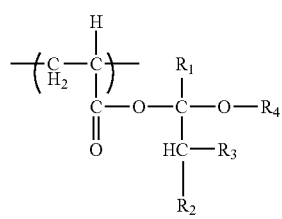
(17)

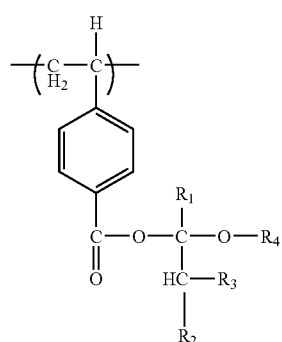
(18)

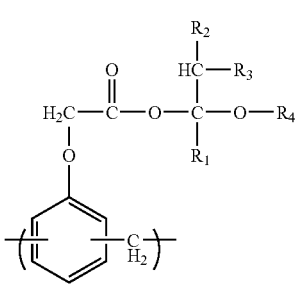
(19)

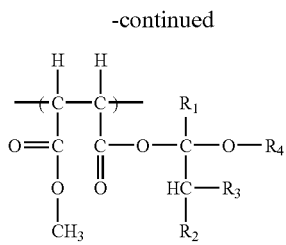

(20)

The polymer having a unit structure of formula (2) can be produced by reaction between a polymer having a carboxyl group and a vinyl ether compound of formula (15).

The polymer having a unit structure of formula (2) can be also produced by polymerization reaction by use of an additional polymerizable monomer having a protected carboxyl group of formula (1). The additional polymerizable monomer having a protected carboxyl group of formula (1) includes for example methacrylic acid hemiacetal ester compounds such as 1-methoxyethyl methacrylate, 1-ethoxyethyl methacrylate, 1-isopropoxyethyl methacrylate, 1-n-hextyloxyethyl methacrylate, tetrahydro-2H-pyran-2-yl-methacrylate and the like, acrylic acid hemiacetal ester compounds such as 1-methoxyethyl acrylate, 1-tert-butoxyethyl acrylate, 1-isopropoxyethyl acrylate, 1-n-butoxyethyl acrylate, tetrahydro-2H-pyran-2-yl-acrylate and the like, 1-ethoxyethyl-4-vinylbenzoate, bis(1-ethoxyethyl)maleate and methyl(1-ethoxyethyl)maleate, and the like.

The production of the polymer having a unit structure of formula (2) contains a case where only one of the above-mentioned additional polymerizable monomers is used and a case where two or more of the above-mentioned additional polymerizable monomers are used in a combination thereof.

In addition, the production of the polymer having a unit structure of formula (2) can be conducted by using in addition to the additional polymerizable monomer having a protected carboxyl group of formula (1), other addition polymerizable monomer in a combination thereof. The other addition polymerizable monomer includes acrylate compound, methacrylate compound, acrylamide compound, methacrylamide compound, vinyl compound, styrene compound, maleimide compound, maleic anhydride, and acrylonitrile, etc.

The acrylate compound includes methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamanthyl acrylate, 2-methoxybutyl-2-adamantyl acrylate, 8methyl-8-tricyclodecyl acrylate, 8-ethyl-8-tricyclodecyl acrylate, and 5-acryloyloxy-6-hydroxynorbornene-2-carboxylic-6-lactone, etc.

The methacrylate compound includes ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, n-lauryl methacrylate, n-stearyl methacrylate, methoxydiethylene glycol methacrylate, methoxy polyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamanthyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, and 2,2,3,3,4,4,4-heptafluorobutyl methacrylate, etc.

In addition, the acrylate compound and methacrylate compound include the compounds of formulae (21) to (23).

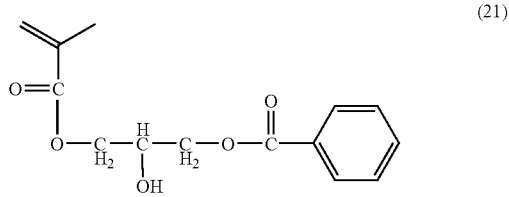

(21)

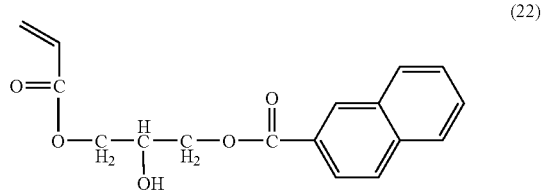

(22)

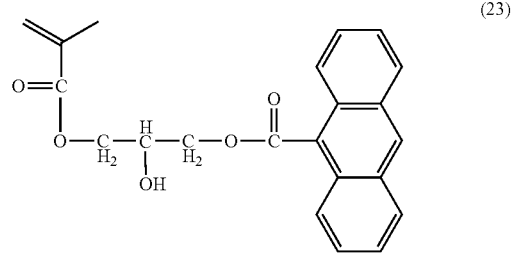

(23)

The acrylamide compound includes acrylamide, N-methyl acrylamide, N-ethyl acrylamide, N-benzyl acrylamide, N-phenyl acrylamide, and N,N-dimethyl acrylamide, etc.

The methacrylamide compound includes methacrylamide, N-methyl methacrylamide, N-ethyl methacrylamide, N-benzyl methacrylamide, N-phenyl methacrylamide, and N,N-dimethyl methacrylamide, etc.

The vinyl compound includes vinyl ether, methyl vinyl ether, benzyl vinyl ether, 2-hydroxyethyl vinyl ether, phenyl vinyl ether, and propyl vinyl ether, etc.

The styrene compound includes styrene, methyl styrene, chloro styrene, bromo styrene, and hydroxystyrene, etc.

The maleimide compound includes maleimide, N-methyl maleimide, N-phenyl maleimide, and N-cyclohexyl maleimide, etc.

The above-mentioned polymers by use of addition polymerizable monomer can be produced by dissolving an addition polymerizable monomer and optionally a chain transfer agent (10% or less based on the mass of the monomer) in an organic solvent, then adding a polymerization initiator to conduct a polymerization reaction and then adding a short-stop. The added amount of the polymerization initiator is 1 to 10 mass % based on the mass of the monomer, and the added amount of the short-stop is 0.01 to 0.2 mass %. The used organic solvent includes propylene glycol monomethyl ether, propylene glycol monopropyl ether, ethyl lactate, and dimethylformamide, etc., the chain transfer agent includes dodecane thiol and dodecyl thiol, etc., the polymerization initiator includes azobisisobutyronitrile and azobiscyclohexane carbonitrile, etc., and the short-stop includes 4-methoxyphenol, etc. The reaction temperature and the reaction time are suitably selected from 30 to 100° C. and 1 to 24 hours, respectively.

In the production of the polymer containing the unit structure of formula (2) by use of the above-mentioned addition polymerizable monomer, when the addition polymerizable monomer of a protected carboxyl group of formula (1) and other addition polymerizable monomer are used, the use proportion of these monomers signified in the addition polymerizable monomer of a protected carboxyl group of formula (1)/other addition polymerizable monomer is for example 20/1 to 1/20, 10/1 to 1/10, preferably 5/1 to 1/5, or 3/1 to 1/3 in mass ratio. The use proportion signified in the addition polymerizable monomer of a protected carboxyl group of formula (1): other addition polymerizable monomer is for example 0.95:0.05 to 0.05:0.95, or 0.90:0.10 to 0.10:0.90, or 0.80:0.20 to 0.20:0.80, or 0.70:0.30 to 0.30:0.70 in molar ratio.

The polymer containing the unit structure of formula (2) used in the underlayer coating forming composition for lithography according to the present invention has a weight average molecular weight of for example 1000 to 500000, or for example 1000 to 200000, or 3000 to 150000, or 3000 to 50000.

When the polymer containing the unit structure of formula (2) is used in the underlayer coating forming composition of the present invention, only one polymer may be used, or two or more polymers may be used in a combination.

The polymer containing the unit structure of formula (2) used in the underlayer coating forming composition according to the present invention may be any of random polymers, block polymers or graft polymers. The polymer compounds can be produced by any methods such as radical polymerization, anionic polymerization, cationic polymerization or the like. As the type of polymerization, various methods such as solution polymerization, suspension polymerization, emulsion polymerization or bulk polymerization, etc. can be mentioned.

The compound having a group capable of reacting with a carboxyl group contained in the underlayer coating forming composition for lithography according to the present invention is not specifically limited so long as it is a compound having a group that reacts with a carboxyl group to form a chemical bond.

The group capable of reacting with a carboxyl group includes for example epoxy group, oxetanyl group, oxazoline group, cyclocarbonate group, alkoxysilyl group, alkoxyalkyl group, aziridinyl group, methylol group, hydroxy group, isocyanate group, acetal group, hydroxysilyl group, ketal group, vinylether group, aminomethylol group, alkoxymethylamino group and imino group, etc.

Such compounds include for example compounds having an epoxy group such as triglycidyl-p-aminophenol, tetraglycidyl meta-xylene diamine, tetraglycidyl diamino diphenylmethane, tetraglycidyl-1,3-bisaminomethylcyclohexane, bisphenol-A-diglycidyl ether, bisphenol-S-diglycidyl ether, resorcinol diglycidyl ether, diglycidyl phthalate, neopentyl glycol diglycidyl ether, polypropylene glycol diglycidyl ether, cresol novolak polyglycidyl ether, tetrabromo bisphenol-A-diglycidyl ether, bisphenol hexafluoro acetone diglycidyl ether, glycerin triglycidyl ether, pentaerythritol diglycidyl ether, tris-(2,3-epoxypropyl)isocyanurate, monoallyldiglycidyl isocyanurate, and glycidyl methacrylate, etc.

In addition, the polymer compound having a cyclocarbonate group includes for example a compound having a cyclocarbonate group obtained by the reaction of the compound having epoxy group with carbon dioxide, 1,2-propylene carbonate, phenyldioxolone, vinylethylene carbonate, butylene carbonate, tetrachloroethylene carbonate, chloroethylene glycol carbonate, 4-chloromethyl-1,3-dioxolan-2-one, 1,2-dichloroethylene carbonate, 4-(1-propenyloxymethyl)-1,3-dioxolan-2-one, glycerin carbonate, (chloromethyl)ethylene carbonate, 1-benzylglycelol-2,3-carbonate, 4,4-dimethyl-5-methylene-1,3-dioxolan-2-one, and 3,3,3-trifluoropropylene carbonate, etc.

The compound having an isocyanate group includes for example p-phenylenediisocyanate, biphenyldiisocyanate, methylenebis(phenylisocyanate), 2-isocyanate ethyl methacrylate, 1,4-cyclohexyl diisocyanate, 1,3,5-tris(6-isocyanatehexyl)triazinetrione, 1-isocyanatenaphthalene, 1,5-naphthalene diisocyanate, 1-butylisocyanate, cyclohexylisocyanate, benzylisocyanate, 4-chlorophenylisocyanate, isocyanate trimethylsilane, and hexylisocyanate, etc.

The compound having an alkoxysilyl group includes for example triethoxyoctylsilane, tris[3-trimethoxysilyl)propyl]isocyanurate, 3-trimethoxysilyl)-N-[3(trimethoxysilyl)propyl]-1-propanamine, 3-(trimethoxysilyl)propylmethacrylate, 3-isocyanate propyltriethoxysilane, 1,4-bis(trimethoxysilyl)benzene, phenyltriethoxysilane, methyltriethoxysilane, (3-trimethoxysilylpropyl)maleate, 3-(2-aminoethylamino)propyltrimethoxysilane, methyltriactoxyslane, trimethoxy-2-(3,4-epoxycyclohexyl)ethylsilane, 3-trimethoxysilylpropylmethacrylate, trimethoxypropylsilane, 4-(chloromethyl)phenyltrimethoxysilane, 2-(3,4-epoxycyclohexyl)ethyltriethoxysilane, triethoxy-n-dodecylsilane and 2-mercaptoethyl triethoxysilane and the like.

As the compound having a group capable of reacting with a carboxyl group contained in the underlayer coating forming composition of the present invention, the compound having at least two groups of formula (3) can be also used. In formula (3), $R_5$ is hydrogen atom, $C_{1-6}$alkyl group or —$CH_2OR_7$ wherein $R_7$ is hydrogen atom or $C_{1-10}$alkyl group, and $R_6$ is hydrogen atom or $C_{1-10}$alkyl group. The alkyl group includes methyl group, ethyl group, n-butyl group, n-octyl group, isopropyl group, tert-butyl group, 2-ethylhexyl group, and cyclohexyl group, etc.

Such compounds include melamine compounds, urea compounds, glycoluril compounds and benzoguanamine compounds that the hydrogen atom of the amino group is substituted by methylol group or alkoxymethyl group. The concrete examples are hexamethoxymethyl melamine, tetramethoxymethyl benzoguanamine, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc., and methoxymethyl type melamine compounds manufactured by Mitsui Cytec Co., Ltd. (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (high condensation type, trade name: Beckamine J-300S, Beckamine P-955, Beckamine N) and the like. The compounds obtained by condensing the melamine compounds, urea compounds, glycoluril compounds and benzoguanamine compounds that the hydrogen atom of the amino group is substituted by methylol group or alkoxymethyl group, may be also used. For example, the compound includes a compound with a high molecular weight that is produced from a melamine compound (Cymel 303) and a benzoguanamine compound (trade name: Cymel 1123) that is disclosed in U.S. Pat. No. 6,323,310.

As the compound having at least two groups of formula (3) contained in the underlayer coating forming composition of the present invention, the polymer produced by use of acrylamide compounds or methacrylamide compounds substituted by hydroxymethyl group or alkoxymethyl group such as N-hydroxymethyl acrylamide, N-methoxymethyl methacrylamide, N-ethoxymethyl acrylamide, and N-butoxymethyl methacrylamide, etc. can be used. Such polymers can be produced from only acrylamide compounds or methacrylamide compounds substituted by hydroxymethyl group or alkoxymethyl group, or can be also produced from a combination with other addition polymerizable monomer such as the abovementioned acrylate compound, methacrylate compound, acrylamide compound, methacrylamide compound, vinyl compound, styrene compound, maleimide compound, maleic anhydride, and acrylonitrile, etc. In the production of the polymer, when other addition polymerizable monomers are also used, the use proportion thereof signified in acrylamide compound or methacrylamide compound substituted by hydroxymethyl group or alkoxymethyl group/other addition polymerizable monomer is for example 20/1 to 1/20, 10/1 to 1/10, preferably 5/1 to 1/5, or 3/1 to 1/3 in mass ratio The use proportion signified in acrylamide compound or methacrylamide compound substituted by hydroxymethyl group or alkoxymethyl group:other addition polymerizable monomer is for example 0.95:0.05 to 0.05:0.95, or 0.90:0.10 to 0.10:0.90, or 0.80:0.20 to 0.20:0.80, or 0.70:0.30 to 0.30:0.70 in molar ratio.

Such polymers include for example poly(N-butoxymethylacrylamide), a copolymer of N-butoxymethylacrylamide with styrene, a copolymer of N-hydroxymethylmethacrylamide with methylmethacrylate, a copolymer of N-ethoxymethylmethacrylamide with benzylmethacrylate, and a copolymer of N-butoxymethylacrylamide, benzylmethacrylate and 2-hydroxypropylmethacrylate, etc. The polymer has a weight average molecular weight of for example 1000 to 500000, or for example 1000 to 200000, or 3000 to 150000, or 3000 to 50000. The polymer can be used in only one polymer or a combination of two or more polymers.

As the compound having a group capable of reacting with a carboxyl group contained in the underlayer coating forming composition for lithography according to the present invention, the polymer containing at least one unit structure selected from the group consisting of formulae (4), (5), (6), (7), (8) and (9) can be used. In the formulae, P is a bonding group constituting a main chain of the polymer, Q is a direct bond or a linking group, $R_8$, $R_9$, $R_{10}$ and $R_{11}$ are independently of one another, hydrogen atom or $C_{1-6}$alkyl group, and x is 0 or 1. P is not specifically limited so long as it is a bonding group constituting a main chain of the polymer. P is for example the formulae (P-1) to (P4) mentioned below. Q is a linking bond or a direct bond containing at least one selected from phenylene group, —C(=O)—, —CH$_2$—, —NH— and —O—. The concrete examples of Q are for example phenylene group, —C(=O)—O— and —C(=O)—O—CH$_2$—, etc.

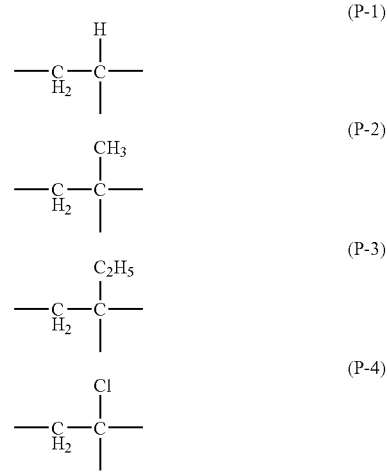

Such polymers can be produced from by use of addition polymerizable monomer having epoxy group, oxetanyl group, oxazoline group, cyclocarbonate group, alkoxysilyl group or isocyanate group. And, in the production of the polymers, a combination with other addition polymerizable monomer such as the abovementioned acrylate compound, methacrylate compound, acrylamide compound, methacrylamide compound, vinyl compound, styrene compound, maleimide compound, maleic anhydride, and acrylonitrile, etc., can be used. In the production of the polymer, when other addition polymerizable monomers are also used, the use proportion thereof signified in addition polymerizable monomer having epoxy group, oxetanyl group, oxazoline group, cyclocarbonate group, alkoxysilyl group or isocyanate group/other addition polymerizable monomer is for example 20/1 to 1/20, 10/1 to 1/10, preferably 5/1 to 1/5, or 3/1 to 1/3 in mass ratio. The use proportion signified in addition polymerizable monomer having epoxy group, oxetanyl group, oxazoline group, cyclocarbonate group, alkoxysilyl group or isocyanate group: other addition polymerizable monomer is for example 0.95:0.05 to 0.05:0.95, or 0.90:0.10 to 0.10:0.90, or 0.80:0.20 to 0.20:0.80, or 0.70:0.30 to 0.30:0.70 in molar ratio.

The addition polymerizable monomer having epoxy group includes for example glycidyl acrylate, and glycidyl methacrylate, etc.

The addition polymerizable monomer having oxetanyl group includes for example (3-ethyl-3-oxetanyl)methylmethacrylate, oxetan-3-yl methylacrylate, (3-methyl-3-oxetanyl)methylmethacrylate, oxetan-2-ylmethylacrylate, and oxetan-2-yl methylmethacrylate, etc.

The addition polymerizable monomer having oxazoline group includes for example 2-isopropenyl-2-oxazoline, etc.

The addition polymerizable monomer having cyclocarbonate group includes for example vinylethylene carbonate, etc.

The addition polymerizable monomer having alkoxysilyl group includes for example vinyltrimethoxysilane, 3-methacryloxypropyltrimethoxysilane, 3-methacryloxypropyltriethoxysilane, 3-methacryloxypropylmethyldiethoxysilane, and 3-acryloxypropyltrimethoxysilane, etc.

The addition polymerizable monomer having isocyanate group includes for example 2-isocyanate ethylmethacrylate, and allylisocyanate, etc.

The polymer containing the unit structure of formula (4) can be also produced by reaction of a polymer having hydroxy group with a compound having epoxy group, such as epichlorohydrin, glycidyltosylate or the like. The polymer includes for example epoxyphenol novolak produced from phenol novolak and epichlorohydrin, other epoxycresol novolak, and epoxynaphthol novolak, etc.

The polymer containing at least one unit structure selected from the group consisting of formulae (4), (5), (6), (7), (8) and (9) has a weight average molecular weight of for example 1000 to 500000, or for example 1000 to 200000, or 3000 to 150000, or 3000 to 50000. The polymer can be used in only one polymer or in a combination of two or more polymers.

In the underlayer coating forming composition of the present invention, the containing proportion of the compound having a protected carboxyl group of formula (1) and the compound having a group capable of reacting with a carboxyl group signified in the compound having a protected carboxyl group of formula (1)/the compound having a group capable of reacting with a carboxyl group is for example 10/1 to 1/10, preferably 5/1 to 1/5, or 3/1 to 1/3 in mass ratio.

The underlayer coating forming composition of the present invention comprises a compound having a group capable of reacting with a carboxyl group, and a protected carboxyl group of formula (1), and a solvent.

The group capable of reacting with a carboxyl group includes groups similar to those mentioned above.

Such compounds include for example compounds having a protected carboxyl group of formula (1) and an epoxy group that can be produced from a compound having an olefin moiety and carboxyl group. After reacting the carboxyl group with the compound of formula (15), the olefin moiety can be epoxidized to produce a compound having a protected carboxyl group of formula (1) and an epoxy group.

The compound having a group capable of reacting with a carboxyl group, and a protected carboxyl group of formula (1) includes polymers having a protected carboxyl group of formula (1) and a group of formula (3). Such polymers can be produced by polymerization reaction of the additional polymerizable monomer having a protected carboxyl group of formula (1), for example methacrylic acid hemiacetal ester compounds such as 1-methoxyethyl methacrylate, 1-ethoxyethyl methacrylate, 1-isopropoxyethyl methacrylate, 1-n-hextyloxyethyl methacrylate, and tetrahydro-2H-pyran-2-yl-methacrylate, etc., acrylic acid hemiacetal ester compounds such as 1-methoxyethyl acrylate, 1-tert-butoxyethyl acrylate, 1-isopropoxyethyl acrylate, 1-n-butoxyethyl acrylate, and tetrahydro-2H-pyran-2-yl-acrylate, etc., 1-ethoxyethyl-4-vinylbenzoate, bis(1-ethoxyethyl)maleate and methyl(1-ethoxyethyl)maleate, and the like, with acrylamide compounds or methacrylamide compounds substituted by hydroxymethyl group or alkoxymethyl group such as N-hydroxymethyl acrylamide, N-methoxymethyl methacrylamide, N-ethoxymethyl acrylamide, and N-butoxymethyl methacrylamide, and the like. In the production of the polymer, other addition polymerizable monomers as mentioned above can be used if necessary. The proportion of the additional polymerizable monomer having a protected carboxyl group of formula (1) and the acrylamide compound or methacrylamide compound substituted by hydroxymethyl group or alkoxymethyl group used in the production of the polymer signified in the additional polymerizable monomer having a protected carboxyl group of formula (1)/the acrylamide compound or methacrylamide compound substituted by hydroxymethyl group or alkoxymethyl group is for example 20/1 to 1/20, 10/1 to 1/10, preferably 5/1 to 1/5, or 3/1 to 1/3 in mass ratio. The use proportion signified in the additional polymerizable monomer having a protected carboxyl group of formula (1): the acrylamide compound or methacrylamide compound substituted by hydroxymethyl group or alkoxymethyl group is for example 0.95:0.05 to 0.05:0.95, or 0.90:0.10 to 0.10:0.90, or 0.80:0.20 to 0.20:0.80, or 0.70:0.30 to 0.30:0.70 in molar ratio.

In addition, when the above-mentioned other addition polymerizable monomer is used, the proportion is for example 0.5 to 80 mass %, or 1 to 70 mass %. or 5 to 50 mass % in all monomers used in the production of the polymer. Such polymers can be produced according the above-mentioned process in which the polymerization initiator is used. The polymers have a weight average molecular weight of for example 1000 to 500000, or for example 1000 to 200000, or 3000 to 150000, or 3000 to 50000. The polymer can be used in only one polymer, or a combination of two or more polymers.

As the compound having a group capable of reacting with a carboxyl group and a protected carboxyl group of formula (1), polymers containing a unit structure of formula (2) and at least one unit structure selected from the group consisting of formulae (4), (5), (6), (7), (8) and (9) can be also used. Such polymers can be produced by polymerization reaction of the addition polymerizable monomer having a protected carboxyl group of formula (1) with the above-mentioned addition polymerizable monomer having epoxy group, oxetanyl group, oxazoline group, cyclocarbonate group, alkoxysilyl group or isocyanate group. In the production of the polymers, other addition polymerizable monomer as mentioned above, or the above mentioned acrylamide compound or methacrylamide compound substituted by hydroxymethyl group or alkoxymethyl group can be used together.

The proportion of the addition polymerizable monomer having a protected carboxyl group of formula (1) and the addition polymerizable monomer having epoxy group, oxetanyl group, oxazoline group, cyclocarbonate group, alkoxysilyl group or isocyanate group used in the production of the polymer signified in the addition polymerizable monomer having a protected carboxyl group of formula (1)/the addition polymerizable monomer having epoxy group, oxetanyl group, oxazoline group, cyclocarbonate group, alkoxysilyl group or isocyanate group is for example 20/1 to 1/20, 10/1 to 1/10, preferably 5/1 to 1/5, or 3/1 to 1/3 in mass ratio. The use proportion signified in the addition polymerizable monomer having a protected carboxyl group of formula (1): the addition polymerizable monomer having epoxy group, oxetanyl group, oxazoline group, cyclocarbonate group, alkoxysilyl group or isocyanate group is for example 0.95:0.05 to 0.05:0.95, or 0.90:0.10 to 0.10:0.90, or 0.80:0.20 to 0.20:0.80, or 0.70:0.30 to 0.30:0.70 in molar ratio.

In addition, when the above-mentioned other addition polymerizable monomer or acrylamide compounds or methacrylamide compounds substituted by hydroxymethyl group or alkoxymethyl group are used, the proportion is for example 0.5 to 80 mass %, or 1 to 70 mass %, or 5 to 50 mass % in all monomers used in the production of the polymer. Such polymers can be produced according the abovementioned process in which the polymerization initiator is used.

As the compound having a group capable of reacting with a carboxyl group and a protected carboxyl group of formula (1), polymers containing the unit structure of formulae (10) and (11):

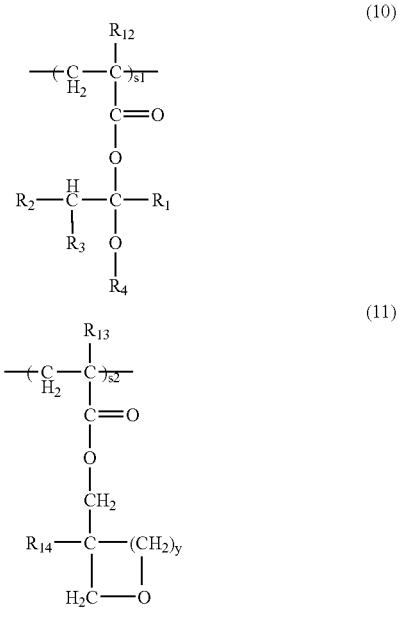

can be also mentioned. In the formulae, $R_{12}$ and $R_{13}$ are independently of each other hydrogen atom or methyl group, $R_{14}$ is hydrogen atom, methyl group or ethyl group, y is 0 or 1, $s_1$ and $s_2$ are molar ratio of each unit structure constituting the polymer, $s_1$ is 0.05 to 0.95 or 0.10 to 0.90 or 0.20 to 0.80 or 0.30 to 0.70 and $s_2$ is 0.05 to 0.95 or 0.10 to 0.90 or 0.20 to 0.80 or 0.30 to 0.70, with proviso that $0.1 \leq s_1+s_2 \leq 1$ or $0.2 \leq s_1+s_2 \leq 1$ or $0.4 \leq s_1+s_2 \leq 1$ or $0.6 \leq s_1+s_2 \leq 1$.

The polymers containing the unit structure of formulae (10) and (11) can be produced from the above-mentioned methacrylic acid hemiacetal ester compounds or acrylic acid hemiacetal ester compounds and the addition polymerizable monomers having an epoxy group or the addition polymerizable monomers having an oxetanyl group.

In the production of the polymers containing the unit structure of formulae (10) and (11), the above-mentioned other addition polymerizable monomers such as acrylate compounds, methacrylate compounds, acrylamide compounds, methacrylamide compounds, vinyl compounds, styrene compounds, maleimide compounds, maleic anhydride, and acrylonitrile, etc. can be used together. When the other addition polymerizable monomers are used, they are used so that the proportion (molar ratio) of the unit structure of formulae (10) and (11) in the polymer falls in the above-mentioned range of $s_1$ and $S_2$.

The polymer containing the unit structure of formulae (10) and (11) contained in the underlayer coating forming composition for lithography according to the present invention may be a polymer only consisting of the unit structure of formulae (10) and (11).

In addition, the polymer containing the unit structure of formulae (10) and (11) contained in the underlayer coating forming composition for lithography according to the present invention may be a polymer containing in addition to the unit structure of formulae (10) and (11), other unit structure coming from other addition polymerizable monomer in a proportion (molar ratio) of the unit structure of formulae (10) and (11) in the polymer falling in the above-mentioned range of $s_1$ and $s_2$. For example, the proportion (molar ratio) of the unit structure of formula (10) is 0.10, the proportion (molar ratio) of the unit structure of formula (11) is 0.60, and the proportion (molar ratio) of the other unit structure is 0.30. In addition, for example, the proportion (molar ratio) of the unit structure of formula (10) is 0.50, the proportion (molar ratio) of the unit structure of formula (11) is 0.40, and the proportion (molar ratio) of the other unit structure is 0.10.

As the compound having a group capable of reacting with a carboxyl group and a protected carboxyl group of formula (1), polymers containing the unit structure of formulae (12), (13) and (14):

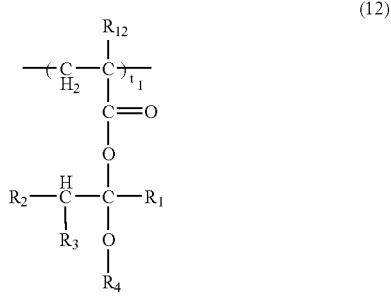

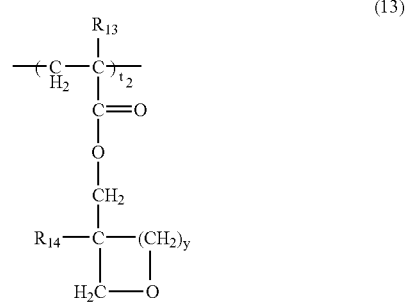

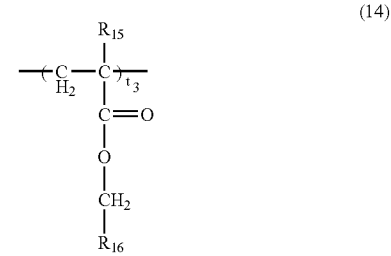

can be also mentioned. In the formulae, $R_{12}$, $R_{13}$ and $R_{14}$ have the above-mentioned meaning, $R_{15}$ is hydrogen atom or methyl group, $R_{16}$ is hydrogen atom, $C_{1-6}$alkyl group, phenyl group, naphthyl group or anthryl group, $t_1$, $t_2$ and $t_3$ are molar ratio of each unit structure constituting the polymer, $t_1$ is 0.05 to 0.90 or 0.15 to 0.80 or 0.25 to 0.60, $t_2$ is 0.05 to 0.90 or 0.15 to 0.80 or 0.25 to 0.60, and $t_3$ is 0.05 to 0.90 or 0.05 to 0.70 or 0.15 to 0.50, with proviso that $0.15 \leq t_1+t_2+t_3 \leq 1$, or $0.35 \leq t_1+t_2+t_3 \leq 1$, or $0.65 \leq t_1+t_2+t_3 \leq 1$. The concrete examples of $C_{1-6}$alkyl group are for example methyl group, ethyl group, isopropyl group, n-hexyl group, and cyclopentyl group, etc.

The polymers containing the unit structure of formulae (12), (13) and (14) can be produced from the above-mentioned methacrylic acid hemiacetal ester compounds or acrylic acid hemiacetal ester compounds, the addition polymerizable monomers having an epoxy group or the addition polymerizable monomers having an oxetanyl group, and monomers providing the unit structure of formula (14). The monomers providing the unit structure of formula (14) include for example methyl acrylate, methyl methacrylate, ethyl methacrylate, isopropyl methacrylate, cyclopropyl acrylate, n-hexyl methacrylate, benzyl acrylate, benzyl methacrylate, naphthylmethyl methacrylate, anthrylmethyl acrylate and anthrylmethyl methacrylate, etc.

In the production of the polymers containing the unit structure of formulae (12), (13) and (14), the above-mentioned other addition polymerizable monomers such as acrylate compounds, methacrylate compounds, acrylamide compounds, methacrylamide compounds, vinyl compounds, styrene compounds, maleimide compounds, maleic anhydride, and acrylonitrile, etc. can be used together. When the other addition polymerizable monomers are used, they are used so that the proportion (molar ratio) of the unit structure of formulae (12), (13) and (14) in the polymer falls in the above-mentioned range of $t_1$, $t_2$ and $t_3$.

The polymer containing the unit structure of formulae (12), (13) and (14) contained in the underlayer coating forming composition for lithography according to the present invention may be a polymer only consisting of the unit structure of formulae (12), (13) and (14).

In addition, the polymer containing the unit structure of formulae (12), (13) and (14) contained in the underlayer coating forming composition according to the present invention may be a polymer containing in addition to the unit structure of formulae (12), (13) and (14), other unit structure coming from other addition polymerizable monomer in a proportion (molar ratio) of the unit structure of formulae (12), (13) and (14) in the polymer falling in the above-mentioned range of $t_1$, $t_2$ and $t_3$. For example, the proportion (molar ratio) of the unit structure of formula (12) is 0.25, the proportion (molar ratio) of the unit structure of formula (13) is 0.35, the proportion (molar ratio) of the unit structure of formula (14) is 0.05, and the proportion (molar ratio) of the other unit structure is 0.35. In addition, for example, the proportion (molar ratio) of the unit structure of formula (12) is 0.35, the proportion (molar ratio) of the unit structure of formula (13) is 0.45, the proportion (molar ratio) of the unit structure of formula (14) is 0.15, and the proportion (molar ratio) of the other unit structure is 0.05

Such polymers have a weight average molecular weight of for example 1000 to 500000, or for example 1000 to 200000, or 3000 to 150000, or 3000 to 50000. The polymer can be used in only one polymer, or a combination of two or more polymers.

As the compound having a group capable of reacting with a carboxyl group and a protected carboxyl group of formula (1) contained in the underlayer coating forming composition for lithography according to the present invention, for example the polymers of formulae (24) to (52) in which $p_1$, $p_2$, $p_3$ and $p_4$ are the proportion (molar ratio) of each unit structure in the polymer can be mentioned.

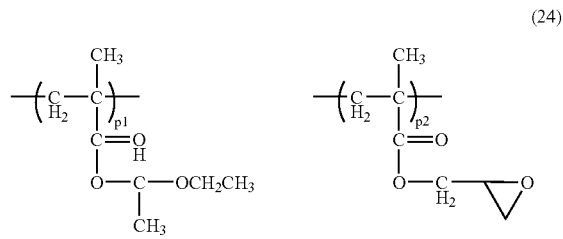
(24)

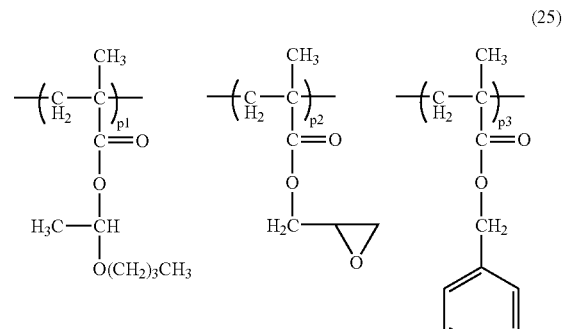
(25)

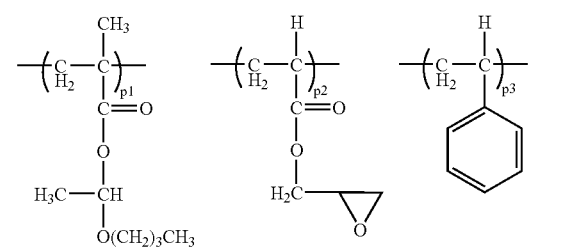
(26)

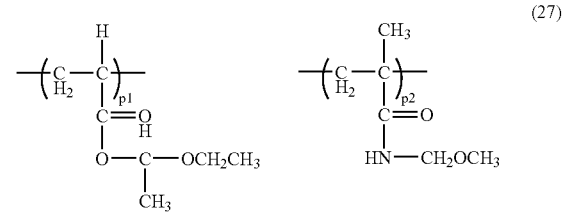
(27)

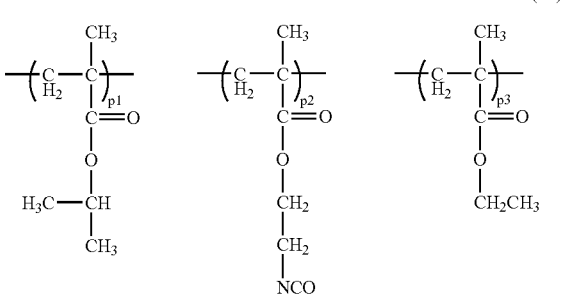
(28)

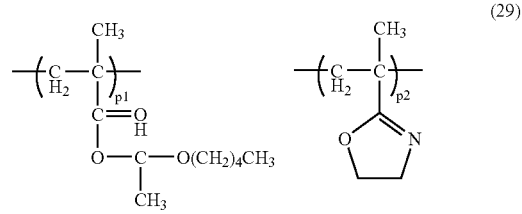
(29)

-continued
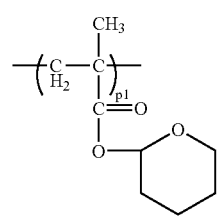 (30)
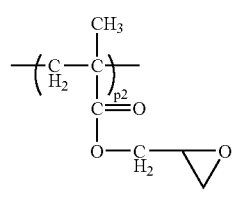
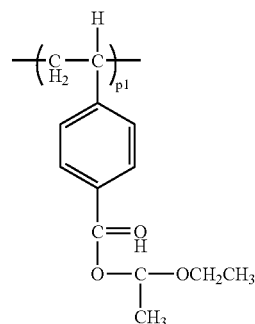 (31)
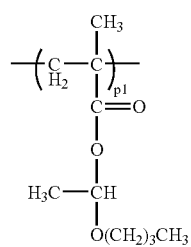 (32)
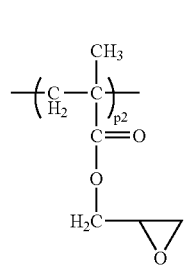
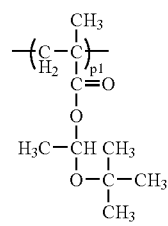 (33)
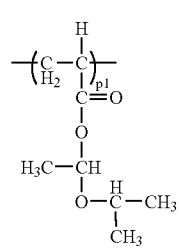 (34)
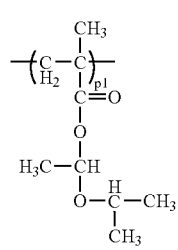 (35)
-continued
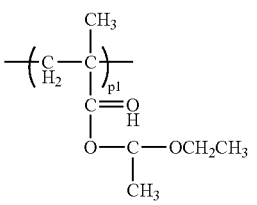 (36)
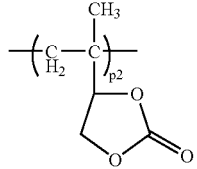
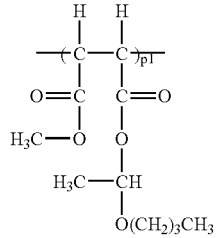 (37)
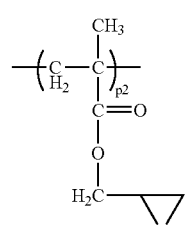
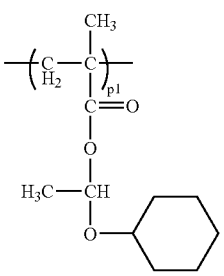 (38)
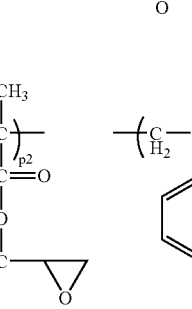
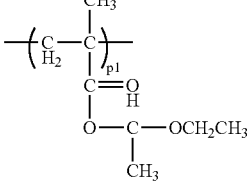 (39)
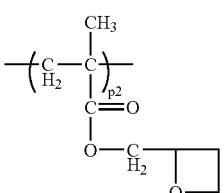 (40)
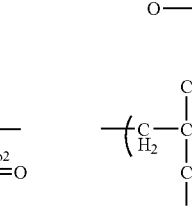 (41)

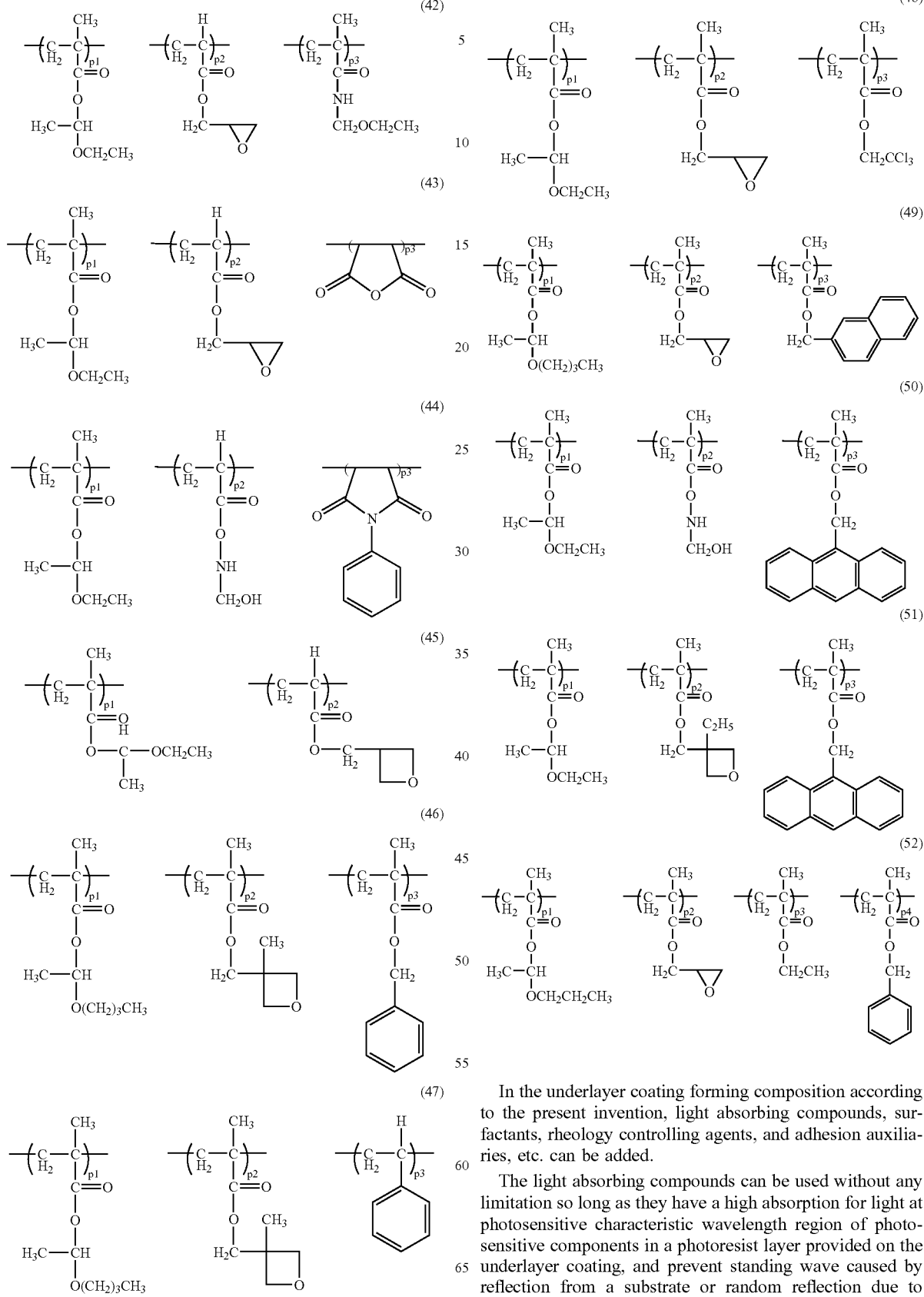

In the underlayer coating forming composition according to the present invention, light absorbing compounds, surfactants, rheology controlling agents, and adhesion auxiliaries, etc. can be added.

The light absorbing compounds can be used without any limitation so long as they have a high absorption for light at photosensitive characteristic wavelength region of photosensitive components in a photoresist layer provided on the underlayer coating, and prevent standing wave caused by reflection from a substrate or random reflection due to unevenness on the substrate surface.

As the light absorbing compounds, can be used benzophenone compounds, benzotriazole compounds, azo compounds, naphthalene compounds, anthracene compounds, anthraquinone compounds, triazine compounds, triazine trione compounds, quinoline compounds and the like. Naphthalene compounds, anthracene compounds, triazine compounds and triazine trione compounds are preferably used. Compounds having a carboxyl group or a phenolic hydroxyl group are preferably used. Specific examples include for example 1-naphthalene carboxylic acid, 2-naphthalene carboxylic acid, 1-naphthol, 2-naphthol, naphthyl acetate, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene dicarboxylic acid, 9-anthracene carboxylic acid, 10-bromo-9-anthracene carboxylic acid, anthracene-9,10-dicarboxylic acid, 1-anthracene carboxylic acid, 1-hydroxyanthracene, 1,2,3-anthracenetriol, 2,7,9-anthracenetriol, benzoic acid, 4-hydroxybenzoic acid, 4-bromobenzoic acid, 3-iodobenzoic acid, 2,4,6-tribromophenol, 2,4,6-tribromoresorcinol, 3,4,5-triiodobenzoic acid, 2,4,6-triiodo-3-aminobenzoic acid, 2,4,6-triiodo-3-hydroxybenzoic acid, 2,4,6-tribromo-3-hydroxybenzoic acid and the like. In addition, the light absorbing compounds include for example polymers having the unit structure of formula (53), (54) or (55), or the compound of formula (56). In formula (56), Ar is benzene ring, naphthalene ring or anthracene ring that may be substituted by $C_{1-5}$alkyl group, $C_{1-5}$alkoxy group, fluorine atom, chlorine atom, bromine atom, iodine atom, nitro group, cyano group, hydroxy group, thiol group, $C_{1-5}$thiolkyl group, carboxyl group, phenoxy group, acetyl group, $C_{1-5}$alkoxycarbonyl group or vinyl group.

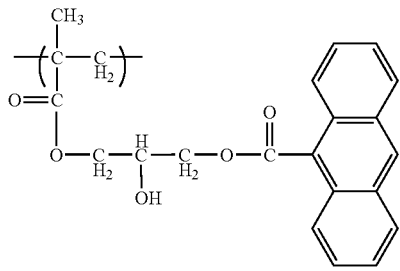

(53)

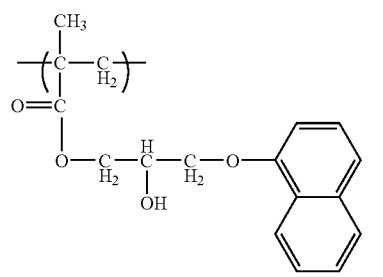

(54)

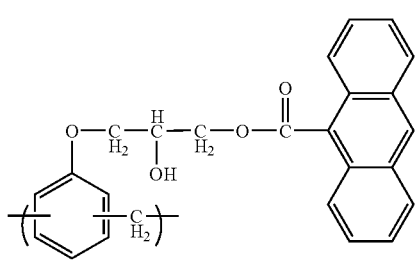

(55)

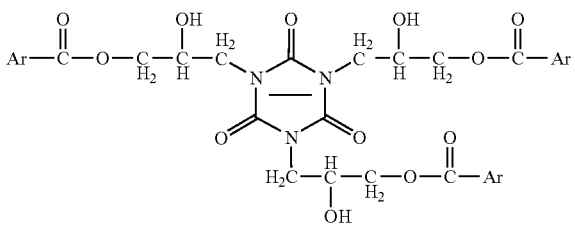

(56)

These light absorbing compounds can be used alone or in a combination of two or more compounds. When the light absorbing compounds are contained in the underlayer coating forming composition of the present invention, the blending amount is 30 mass % or less, for example 1 to 20 mass % or 1 to 10 mass % in the solid content.

The underlayer coating forming composition for lithography according to the present invention may contain surfactants. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.2 mass % or less, preferably 0.1 mass % or less in all components of the underlayer coating forming composition according to the present invention. The surfactants may be added singly or in combination of two or more.

In the underlayer coating forming composition for lithography according to the present invention, a photoacid generator can be added in order to conform the acidity of an underlayer coating to that of a photoresist provided on the underlayer coating in lithography process. The photoacid generator includes onium salt compounds, sulfone imide compounds, and disulfonyl diazomethane compounds, etc.

The onium salt compounds include iodonium salt compounds such as diphenyl iodonium hexafluorophosphate, diphenyl iodonium trifluoromethane sulfonate, diphenyl iodonium nonafluoro-n-butane sulfonate, diphenyl iodonium perfluoro-n-octane sulfonate, diphenyliodonium camphor sulfonate, bis(4-t-butylphenyl)iodonium camphor sulfonate and bis(4-tert-butylphenyl)iodonium trifluoromethane sulfonate, etc., and sulfonium salt compounds such as triphenylsulfonium hexafluoroantimonate, triphenylsulfonium nonafluororo-n-butane sulfonate, triphenylsulfonium camphor sulfonate and triphenylsulfonium trifluoromethane sulfonate, etc.

The sulfone imide compounds include for example N-(trifluoromethane sulfonyloxy)succinimide, N-nonafluoro-n-butanesulfonyloxy)succinimide, N-(camphorsulfonyloxy) succinimide and N-(trifluoromethanesulfonyloxy) naphthalimide, etc.

The disulfonyl diazomethane compounds include for example bis(trifluoromethylsulfonyl)diazomethane, bis(cyclohexylsulfonyl)diazomethane, bis(phenylsulfonyl)diazomethane, bis(p-toluene)sulfonyldiazomethane, bis(2,4-dimethylbenzenesulfonyl)diazomethane, and methylsulfonyl-p-toluenesulfonyl diazomethane, etc.

These photoacid generators can be used singly or in a combination of two or more. When the photoacid generator is used, the content amount thereof is 20 mass % or less, 0.01 to 10 mass %, or 0.1 to 5 mass %, or 0.5 to 3 mass % in the solid content of the underlayer coating forming composition.

The underlayer coating forming composition according to the present invention may contain rheology controlling agents, adhesion auxiliaries, etc., if necessary.

The rheology controlling agents include for example dimethyl phthalate, diethyl phthalate, diisobutyl phthalate, dihexyl phthalate, butyl isodecyl phthalate, di-n-butyl adipate, diisobutyl adipate, diisooctyl adipate, octyldecyl adipate, di-n-butyl maleate, diethyl maleate, dinonyl maleate, methyl oleate, butyl oleate, tetrahydrofurfuryl oleate, n-butyl stearate, and glyceryl stearate, etc. The rheology controlling agents are added in a proportion of usually less than 10 mass % in the solid content of the underlayer coating forming composition.

The adhesion auxiliaries include for example trimethylchlorosilane, dimethylvinylchlorosilane, methyl diphenylchlorosilane, chloromethyldimethyl chlorosilane, trimethylmethoxysilane, dimethyldiethoxysilane, methyldimethoxysilane, dimethylvinylethoxysilane, γ-methacryloxypropyltrimethoxysilane, diphenyldimethoxysilane, phenyltriethoxysilane, hexamethyldisilazane, N,N'-bis(trimethylsilyl)urea, dimethyltrimethylsilylamine, trimethylsilylimidazole, vinyltrichlorosilane, γ-chloropropyltrimethoxysilane, γ-aminopropyltriethoxysilane, γ-glycidoxypropyltrimethoxysilane, γ-methacryloxypropyltrimethoxysilane, benzotriazole, benzimidazole, indazole, imidazole, 2-mercaptobenzimidazole, 2-mercaptobenzothiazole, 2-mercaptobenzoxazole, urazole, thiouracyl, mercaptoimidazole, mercaptopyrimidine, 1,1-dimethylurea, 1,3-dimethylurea and thioureas, etc. The adhesion auxiliaries are added in a proportion of usually less than 2 mass %, in the solid content of the underlayer coating forming composition.

In the underlayer coating forming composition for lithography according to the present invention, several solvents can be used as a solvent. As the solvents, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone, etc. These solvents may be used singly or in combination of two or more of them. Further, high boiling solvents such as propylene glycol monobutyl ether or propylene glycol monobutyl ether acetate, etc. may be mixed and used.

Hereinafter, the utilization of the underlayer coating forming composition for lithography according to the present invention is described.

On a semiconductor substrate (for example, silicon/silicon dioxide coat substrate, silicon nitride substrate, glass substrate, ITO substrate or the like), the underlayer coating forming composition for lithography according to the present invention is coated by a suitable coating method, for example, with a spinner, a coater or the like, and thereafter the substrate is baked to fabricate an underlayer coating. The conditions of baking are suitably selected from baking temperature of 80 to 250° C. and baking time of 0.3 to 60 minutes. Preferably the baking temperature is 130 to 250° C. and the baking time is 0.5 to 5 minutes. The thickness of the underlayer coating is for example 0.01 to 3.0 μm, or for example 0.03 to 1.0 μm, or for example 0.05 to 0.50 μm.

The underlayer coating forming composition for lithography according to the present invention comprises a compound having a protected carboxyl group of formula (1), and a compound having a group capable of reacting with a carboxyl group, or comprises a compound having a group capable of reacting with a carboxyl group, and a protected carboxyl group of formula (1). When the composition is applied on a semiconductor substrate, and baked to form an underlayer coating, the protected carboxyl group of formula (1) decomposes due to heat to provide a carboxyl group (formula (EQ1)). Then, the resulting carboxyl group reacts with the above-mentioned group capable of reacting with a carboxyl group such as an epoxy group, an oxetanyl group, an alkoxysilyl group, an aminomethylol group, an alkoxymethylamino group, and an isocyanate group, etc. during baking. This reaction leads to mutual combination of compounds contained in the underlayer coating forming composition. For example, it is assumed that the carboxyl group reacts with an epoxy group as shown in formula (EQ2).

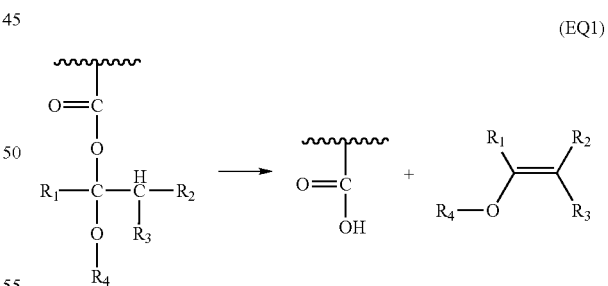

(EQ1)

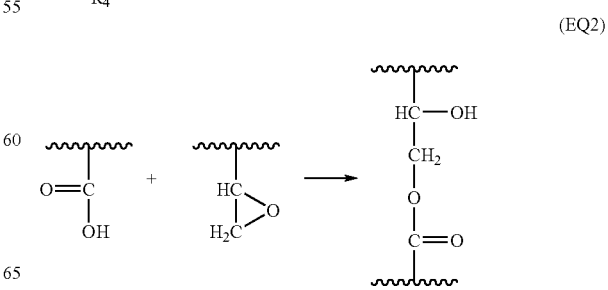

(EQ2)

In addition, it is assumed that the carboxyl group reacts with an oxetanyl group, an isocyanate group, an alkoxysilyl group, an alkoxymethylamino group, an oxazoline group and cyclocarbonate group as shown in formulae (EQ3) to (EQ8), respectively.

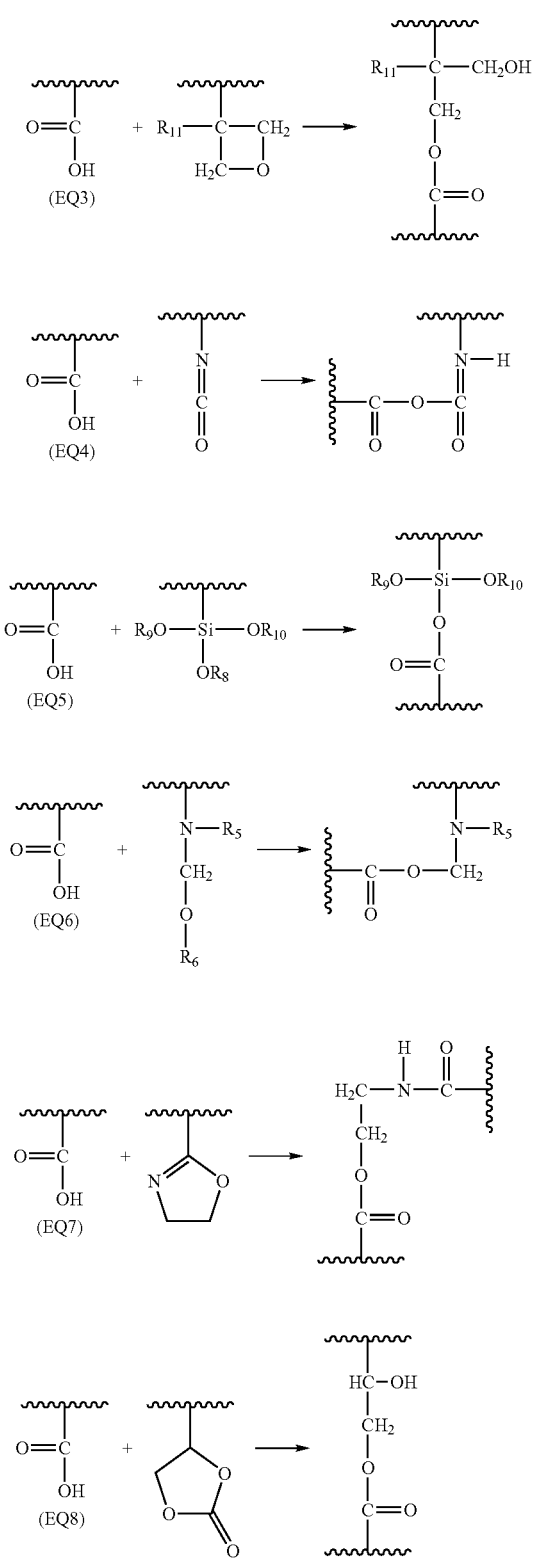

In particular, in case where compounds having two or more protected carboxyl groups of formula (1) and two or more groups capable of reacting with a carboxyl group are used, a continuous combination between the compounds is formed by the reaction of the carboxyl groups with the groups capable of reacting with carboxyl groups. And, the formed underlayer coating becomes tough due to the continuous combination between the compounds As a result of it, the underlayer coating becomes low in solubility in an organic solvent generally used for photoresist composition applied on the underlayer coating, for example ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate and butyl lactate. Consequently, the underlayer coating formed from the underlayer coating forming composition of the present invention causes no intermixing with photoresists. In addition, in case where the compound having many reaction moieties is used, it is assumed that the formed underlayer coating becomes tougher. In particular, when a polymer having a protected carboxyl group of formula (1) or a group capable of reacting with a carboxyl group is used, it is assumed that a crosslink structure is formed during baking and the underlayer coating becomes tougher. Therefore, it is preferable that the underlayer coating forming composition of the present invention contains a polymer having a protected carboxyl group of formula (1), a polymer having a group capable of reacting with a carboxyl group, or a polymer having a group capable of reacting with a carboxyl group and a protected carboxyl group of formula (1).

The formation of carboxyl group due to thermolysis of the protected carboxyl group of formula (1), and the reaction of the resulting carboxyl group with an epoxy group, an oxetanyl group, an oxazoline group, an alkoxysilyl group, an aminomethylol group, and an isocyanate group, etc. easily proceed under baking condition, and therefore these reactions require no catalyst. Thus, the underlayer coating forming composition of the present invention dose not require to add a strong acid catalyst such as sulfonic acid, etc. that has been generally used as a crosslinking catalyst for compositions for forming conventional crosslinking underlayer coatings. Further, the system in which polymers in the underlayer coating forming composition of the present invention form a crosslink structure due to mutual reaction thereof dose not contain low molecular crosslinking agents that have been generally used conventionally, and therefore the present invention can reduce sublimation substances produced during baking in its amount, and avoid contamination of semiconductor substrates or clean-room caused by particles or foreign substances derived from the sublimation substances.

Next, a photoresist layer is formed on the underlayer coating. The formation of the photoresist layer can be conducted by well-known process, that is, by application of a photoresist composition solution on the underlayer coating and baking.

The photoresist to be coated and formed on the underlayer coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkalisoluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like ran be mentioned.

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake (PEB) may be performed, if necessary. The post exposure bake is conducted by suitably selecting from a heating temperature of 70 to 150° C. and a heating time of 0.3 to 10 minutes.

Next, development is conducted by use of a developer for photoresist. For example in case where a developer for positive type photoresist is used, the development results in removal of exposed part of the photoresist and forming of photoresist pattern. The developer for photoresist includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, chlorine or the like, amine aqueous solution such as ethanolamine, propylamine, ethylenediamine or the like. Further, surfactants can be added in these developers. The condition of development is suitably selected from a temperature of 5 to 50° C. and a time of 10 to 300 seconds.

Then, removal of the underlayer coating and processing of the semiconductor substrate are conducted by using the photoresist pattern formed as mentioned above as a protective coating. The removal of the underlayer is conducted by use of a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, etc.

Before or after forming the underlayer coating of the present invention on a semiconductor substrate, an organic anti-reflective coating layer may be applied and formed. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a polymer and a solvent, one containing as main components a polymer having a light absorbing group through chemical bond, a crosslinking agent and a solvent, one containing as main components a light absorbing compound, a crosslinking agent and a solvent, and one containing as main components a polymer type crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The polymers include polyesters, polyimides, polystyrenes, novolak resins, polyacetals, acrylic polymers, and the like. The polymers having a light absorbing group through chemical bond include polymers having a light absorbing aromatic ring structure such as anthracene ring, naphthalene ring, benzene ring, quinoline ring, quinoxaline ring or thiazole ring.

The semiconductor substrates on which the underlayer coating forming composition of the present invention is applied may be substrates on which an inorganic anti-reflective coating is formed by CVD method or the like, and the underlayer coating of the present invention can be formed thereon.

The underlayer coating formed from the underlayer coating forming composition of the present invention may contain an absorption for light used in the lithography process. In such a case, the underlayer coating can be used as a layer having a preventive effect against light reflected from the substrate, that is, as an anti-reflective coating.

In case where the underlayer coating is used as an anti-reflective coating in the lithography process by use of irradiation light of KrF excimer laser beam (wavelength 248 nm), it is preferable that the solid content in the underlayer coating forming composition contains a component containing an anthracene ring or a naphthalene ring. In case where the underlayer coating is used as an anti-reflective coating in the lithography process by use of irradiation right of ArF excimer laser beam (wavelength 193 nm), it is preferable-that the solid content in the underlayer coating forming composition contains a component containing a benzene ring. In case where the underlayer coating is used as an anti-reflective coating in the lithography process by use of irradiation light of F2 excimer laser beam (wavelength 157 nm), it is preferable that the solid content in the underlayer coating forming composition contains a component containing a bromine atom or an iodine atom.

Further, the underlayer coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion and adverse effects of substances formed in the substrate on baking under heating to the upper layer photoresist, or as a barrier layer for reducing any poisoning effect of the photoresist layer by the semiconductor substrate dielectric layer.

In addition, the underlayer coating formed from the underlayer coating forming composition for lithography can be used as a filling agent that can fill via holes without gap or as a flattening agent for flattening a substrate surface, by applying it for the substrate on which via holes are formed and which is used in dual damascene process.

Hereinafter, the present invention will be described based on examples but the present invention is not limited thereto.

EXAMPLES

Synthetic Example 1

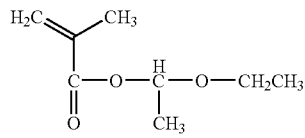

(57)

In 76 g of propylene glycol monomethyl ether acetate, 10 g of 1-ethoxyethyl methacrylate (product of Honshu Chemical Industry Co., Ltd.) of formula (57) and 9 g of glycidyl methacrylate were dissolved, nitrogen was flowed to the reaction solution for 30 minutes, and then the temperature was raised to 70° C. While maintaining the reaction solution at 70° C., 0.38 g of azobisisobutyronitrile and 0.38 g of 1-dodecane thiol were added. After stirring under nitrogen atmosphere at 70° C. for 8 hours, 0.1 g of 4-methoxyphenol was added to obtain a solution containing a copolymer of 1-ethoxyethyl methacrylate and glycidyl methacrylate. GPC analysis of the resulting polymer showed that it had a number average molecular weight Mn of 7600 and a weight average molecular weight Mw of 23000 (in terms of standard polystyrene).

Synthetic Example 2

In 126.6 g of propylene glycol monomethyl ether acetate, 10 g of 1-ethoxyethyl methacrylate (product of Honshu Chemical Industry Co., Ltd.) of formula (57), 9 g of glycidyl methacrylate and 12.7 g of methylmethacrylate were dissolved, nitrogen was flowed to the reaction solution for 30 minutes, and then the temperature was raised to 70° C. While maintaining the reaction solution at 70° C., 0.63 g of azobisisobutyronitrile and 0.63 g of 1-dodecane thiol were added. After stirring under nitrogen atmosphere at 70° C. for 8 hours, 0.1 g of 4-methoxyphenol was added to obtain a solution containing a copolymer of 1-ethoxyethyl methacrylate, glycidyl methacrylate and methyl methacrylate. GPC analysis of the resulting polymer showed that it had a number average molecular weight Mn of 5500 and a weight average molecular weight Mw of 12000 (in terms of standard polystyrene).

Synthetic Example 3

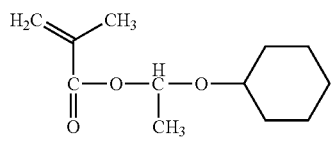

(58)

In 38.0 g of butyl acetate, 15 g of 1-cyclohexyloxyethyl methacrylate (product of Honshu Chemical Industry Co., Ltd.) of formula (58) and 10 g of glycidyl methacrylate were dissolved, nitrogen was flowed to the reaction solution for 30 minutes, and then the temperature was raised to 70° C. While maintaining the reaction solution at 70° C., 0.25 g of azobisisobutyronitrile and 0.25 g of 1-dodecane thiol were added. After stirring under nitrogen atmosphere at 70° C. for 8 hours, 0.1 g of 4-methoxyphenol was added to obtain a solution containing a copolymer of 1-cyclohexyloxyethyl methacrylate and glycidyl methacrylate. GPC analysis of the resulting polymer showed that it had a number average molecular weight Mn of 9000 and a weight average molecular weight Mw of 50000 (in terms of standard polystyrene).

Synthetic Example 4

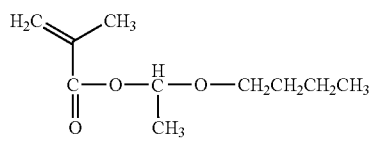

(59)

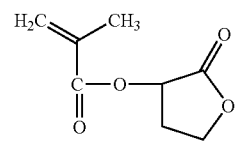

(60)

In 128 g of ethyl lactate, 10.5 g of 1-butoxyethyl methacrylate of formula (59), 8.0 g of glycidyl methacrylate, 9.9 g of benzyl methacrylate and 3.2 g of butyrolactone methacrylate of formula (60) were dissolved, nitrogen was flowed to the reaction solution for 30 minutes, and then the temperature was raised to 70° C. While maintaining the reaction solution at 70° C., 0.25 g of azobisisobutyronitrile and 0.25 g of 1-dodecane thiol were added. After stirring under nitrogen atmosphere at 70° C. for 8 hours, 0.1 g of 4-methoxyphenol was added to obtain a solution containing a copolymer of 1-butoxyethyl methacrylate, glycidyl methacrylate, benzyl methacrylate and butyrolactone methacrylate. GPC analysis of the resulting polymer showed that it had a number average molecular weight Mn of 7000 and a weight average molecular weight Mw of 21000 (in terms of standard polystyrene).

Synthetic Example 5

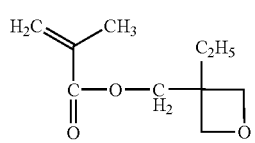

(61)

In 36.77 g of propylene glycol monomethyl ether acetate, 7.0 g of 1-ethoxyethyl methacrylate (product of Honshu Chemical Industry Co., Ltd.) of formula (57) and 8.15 g of (3-ethyl-3-oxetanyl)methylmethacrylate (product of Osaka Organic Chemical Ltd.) of formula (61) were dissolved, nitrogen was flowed to the reaction solution for 30 minutes, and then the temperature was raised to 70° C. While maintaining the reaction solution at 70° C., 0.303 g of azobisisobutyronitrile and 0.303 g of 1-dodecane thiol were added. After stirring under nitrogen atmosphere at 70° C. for 8 hours, 0.1 g of 4-methoxyphenol was added to obtain a solution containing a copolymer of 1-ethoxyethyl methacrylate and (3-ethyl-3-oxetanyl)methylmethacrylate. GPC analysis of the resulting polymer showed that it had a number average molecular weight Mn of 4300 and a weight average molecular weight Mw of 7900 (in terms of standard polystyrene).

Synthetic Example 6

In 78.88 g of propylene glycol monomethyl ether acetate, 8.0 g of 1-ethoxyethyl methacrylate (product of Honshu Chemical Industry Co., Ltd.) of formula (57), 9.32 g of (3-ethyl-3-oxetanyl)methylmethacrylate (product of Osaka Organic Chemical Ltd.) of formula (61) and 15.19 g of methylmethacrylate were dissolved, nitrogen was flowed to the reaction solution for 30 minutes, and then the temperature was raised to 70° C. While maintaining the reaction solution at 70° C., 0.650 g of azobisisobutyronitrile and 0.650 g of 1-dodecane thiol were added. After stirring under nitrogen atmosphere at 70° C. for 8 hours, 0.1 g of 4-methoxyphenol was added to obtain a solution containing a copolymer of 1-ethoxyethyl methacrylate, (3-ethyl-3-oxetanyl)methylmethacrylate and methylmethacrylate. GPC analysis of the resulting polymer showed that it had a number average molecular weight Mn of 5000 and a weight average molecular weight Mw of 9200 (in terms of standard polystyrene).

Synthetic Example 7

In 44.64 g of propylene glycol monomethyl ether acetate, 3.43 g of 1-ethoxyethyl methacrylate (product of Honshu Chemical Industry Co., Ltd.) of formula (57), 4.0 g of (3-ethyl-3-oxetanyl)methylmethacrylate (product of Osaka Organic Chemical Ltd.) of formula (61) and 3.28 g of benzylmethacrylate were dissolved, nitrogen was flowed to the reaction solution for 30 minutes, and then the temperature was raised to 70° C. While maintaining the reaction solution at 70° C., 0.22 g of azobisisobutyronitrile and 0.22 g of 1-dodecane thiol were added. After stirring under nitrogen atmosphere at 70° C. for 8 hours, 0.1 g of 4-methoxyphenol was added to obtain a solution containing a copolymer of 1-ethoxyethyl methacrylate, (3-ethyl-3-oxetanyl)methylmethacrylate and benzylmethacrylate. GPC analysis of the resulting polymer showed that it had a number average molecular weight Mn of 22000 and a weight average molecular weight Mw of 37000 (in terms of standard polystyrene).

Synthetic Example 8

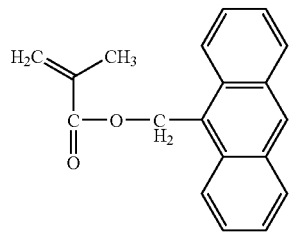

(62)

In 46.4 g of propylene glycol monomethyl ether acetate, 5.00 g of 1-butoxyethyl methacrylate of formula (59), 3.81 g of glycidylmethacrylate, 2.97 9 of 9-anthrylmethylmethacrylate of formula (62) and 6.99 g of methylmethacrylate were dissolved, nitrogen was flowed to the reaction solution for 30 minutes, and then the temperature was raised to 80° C. While maintaining the reaction solution at 80° C., 0.936 g of azobisisobutyronitrile and 0.187 g of 1-dodecane thiol were added. After stirring under nitrogen atmosphere at 80° C. for 8 hours, 0.10 g of 4-methoxyphenol was added to obtain a solution containing a copolymer of 1-butoxyethyl methacrylate, glycidylmethacrylate, 9-anthrylmethylmethacrylate and methylmethacrylate. GPC analysis of the resulting polymer showed that it had a number average molecular weight Mn of 3100 and a weight average molecular weight Mw of 8400 (in terms of standard polystyrene).

Example 1

In 10 g of a solution (solid content concentration: 20.6 mass %) containing the polymer obtained in Synthesis Example 1, 1.35 g of propylene glycol monomethyl ether acetate and 3.97 g of ethyl lactate were added to obtain 13.5 mass % solution. Thereafter, the solution was filtered through a micro filter made of polyethylene having a pore diameter of 0.05 µm to prepare an underlayer coating forming composition solution for lithography according to the present invention.

Example 2

In 10 g of a solution (solid content concentration: 20.6 mass %) containing the polymer obtained in Synthesis Example 2, 1.35 g of propylene glycol monomethyl ether acetate and 3.97 g of ethyl lactate were added to obtain 13.5 mass % solution. Thereafter, the solution was filtered through a micro filter made of polyethylene having a pore diameter of 0.05 µm to prepare an underlayer coating forming composition solution for lithography according to the present invention.

Example 3

In 10 g of a solution (solid content concentration: 40.0 mass %) containing the polymer obtained in Synthesis Example 3, 12.0 g of butyl acetate and 7.72 g of ethyl lactate were added to obtain 13.5 mass % solution. Thereafter, the solution was filtered through a micro filter made of polyethylene having a pore diameter of 0.05 µm to prepare an underlayer coating forming composition solution for lithography according to the present invention.

Example 4

In 10 g of a solution (solid content concentration: 20.6 mass %) containing the polymer obtained in Synthesis Example 4, 1.35 g of ethyl lactate and 3.97 g of propylene glycol monomethyl ether acetate were added to obtain 13.5 mass % solution. Thereafter, the solution was filtered through a micro filter made of polyethylene having a pore diameter of 0.05 µm to prepare an underlayer coating forming composition solution for lithography according to the present invention.

Example 5

In 10 g of a solution (solid content concentration: 30 mass %) containing the polymer obtained in Synthesis Example 5, 6.52 g of ethyl lactate and 5.80 g of propylene glycol monomethyl ether acetate were added to obtain 13.5 mass % solution. Thereafter, the solution was filtered through a micro filter made of polyethylene having a pore diameter of 0.05 µm to prepare an underlayer coating forming composition solution for lithography according to the present invention.

Example 6

In 10 g of a solution (solid content concentration: 30 mass %) containing the polymer obtained in Synthesis Example 6, 6.52 g of ethyl lactate and 5.80 g of propylene glycol monomethyl ether acetate were added to obtain 13.5 mass % solution. Thereafter, the solution was filtered through a micro filter made of polyethylene having a pore diameter of 0.05 µm to prepare an underlayer coating forming composition solution for lithography according to the present invention.

Example 7

In 10 g of a solution (solid content concentration: 20 mass %) containing the polymer obtained in Synthesis Example 7, 1.01 g of ethyl lactate and 3.86 g of propylene glycol monomethyl ether acetate were added to obtain 13.5 mass % solution. Thereafter, the solution was filtered through a micro filter made of polyethylene having a pore diameter of 0.05 µm to prepare an underlayer coating forming composition solution for lithography according to the present invention.

Example 8

In 50 g of a solution (solid content concentration: 30 mass %) containing the polymer obtained in Synthesis Example 8, 30.4 9 of ethyl lactate and 36.0 g of propylene glycol monomethyl ether acetate were added to obtain 13.5 mass % solution. Thereafter, the solution was filtered through a micro filter made of polyethylene having a pore diameter of 0.05 µm to prepare an underlayer coating forming composition solution for lithography according to the present invention.

Dissolution Test in Photoresist Solvent

The underlayer coating forming composition solutions for lithography according to the present invention obtained in Examples 1 to 8 were coated on semiconductor substrates (silicon wafers) by means of a spinner. The coated silicon wafers were baked at 205° C. for 1 minute on a hot plate to form underlayer coatings (film thickness 0.22 µm). The underlayer coatings were dipped in a solvent used for photoresists, for example ethyl lactate, propylene glycol monomethyl ether acetate, and propylene glycol monomethyl ether and as a result it was confirmed that the resulting underlayer coatings were insoluble in these solvents.

Test of Intermixing with Photoresist

The underlayer coating forming composition solutions for lithography according to the present invention obtained in Examples 1 to 8 were coated on silicon wafers by means of a spinner. The coated silicon wafers were baked at 205° C. for 1 minute on a hot plate to form underlayer coatings (film thickness 0.50 µm). On each underlayer coating was coated a commercially available photoresist solution (trade name: GARS 8105G1 manufactured by Fuji Photo Film Co., Ltd. and trade name: SEPR 430 manufactured by Shinetsu Chemical Co., Ltd.) by means of a spinner. The coated wafers were heated at 90° C. or 110° C. for 1.5 minute on a hot plate. After exposure of the photoresists to light, post exposure bake was performed at 90° C. for 1.5 minute. After developing the photoresists, the film thickness of the underlayer coatings was measured and it was confirmed that no intermixing occurred between the underlayer coatings and the photoresist layers.

Test of Flattening Rate and Filling Property

The underlayer coating forming composition solutions for lithography according to the present invention obtained in Examples 1 to 8 were coated on $SiO_2$ wafer substrates having holes (diameter: 0.18 µm, depth: 1.0 µm) by means of a spinner. The used substrates are $SiO_2$ wafer substrates having Iso (isolated) and Dense (dense) patterns of holes as shown in FIG. 1. Iso pattern is a pattern in which the distance from the center of a hole to the center of the adjacent hole is five times as long as the diameter of the hole. Denso pattern is a pattern in which the distance from the center of a hole to the center of the adjacent hole is one time as long as the diameter of the hole. The depth of the holes is 1.0 µm and the diameter thereof is 0.18 µm.

The coated substrates were baked at 205° C. for 1 minute on a hot plate to form underlayer coatings. The film thickness thereof was 0.50 µm at the open area where hole pattern is not present in the vicinity. The flattening rate by the underlayer coatings was assessed by observing with a scanning electron microscope (SEM) the sectional form of the $SiO_2$ wafer substrates having holes on which the underlayer coating forming compositions for lithography according to the present invention obtained in Examples 1 to 8 were applied. The flattening rate was calculated according to the following equation. The flattening rate was 100% when holes on the substrate were perfectly flattened.

Flattening Rate=[1−(dimple depth a of underlayer coating at the center of holes)/(hole depth b)]× 100

In addition, no void (gap) was observed inside the holes, and it was observed that the inside of the holes was filled with the underlayer coating.

TABLE 1

|  | Film Thickness (nm) | | | Flattening Rate (%) | | |
| --- | --- | --- | --- | --- | --- | --- |
|  | Iso | Dense | Bias | Iso | Dense | Bias |
| Example 1 | 500 | 400 | 100 | 100 | 100 | 0 |
| Example 2 | 510 | 430 | 80 | 100 | 100 | 0 |
| Example 3 | 500 | 380 | 120 | 100 | 100 | 0 |
| Example 4 | 530 | 440 | 90 | 100 | 100 | 0 |
| Example 5 | 490 | 430 | 60 | 100 | 100 | 0 |
| Example 6 | 520 | 420 | 100 | 100 | 100 | 0 |
| Example 7 | 500 | 410 | 90 | 100 | 100 | 0 |
| Example 8 | 500 | 400 | 100 | 100 | 100 | 0 |

In Examples 1 to 8, difference (Bias) in film thickness on Iso (isolated) and Dense (dense) patterns could be lowered. It is assumed that the solution of the underlayer coating forming composition for lithography according to the present invention smoothly flows into a plurality of holes even at Dense part having larger hole number (hole density) per unit area on the substrate, thereby providing constant film thickness, and that consequently difference in film thickness of Iso part and Dense part becomes small and flattening rate becomes high. Further, the underlayer coating forming compositions for lithography according to the present invention of Examples 1 to 8 made possible to flatten irrespective of Iso part and Dense part.

Measurement of Optical Parameter

The underlayer coating forming composition solution prepared in Example 4 was coated on a silicon wafer by means of a spinner. The coated silicon wafer was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.83 and attenuation coefficient (k) was 0.40.

The underlayer coating forming composition solution prepared in Example 7 was coated on a silicon wafer by means of a spinner. The coated silicon wafer was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.81 and attenuation coefficient (k) was 0.38.

The underlayer coating forming composition solution prepared in Example 8 was coated on a silicon wafer by means of a spinner. The coated silicon wafer was baked at 205° C. for 1 minute on a hot plate to form an underlayer coating (film thickness 0.50 μm). On the underlayer coating, refractive index (n) and attenuation coefficient (k) at a wavelength of 193 nm were measured with a spectroscopic ellipsometer. As a result of it, refractive index (n) was 1.66 and attenuation coefficient (k) was 0.08. In addition, at a wavelength of 248 nm, refractive index. (n) was 1.50 and attenuation coefficient (k) was 0.26.

Measurement of Dry Etching Rate

The underlayer coating forming composition solutions prepared in Examples 1 to 8 were coated on a silicon wafer by means of a spinner. The coated silicon wafers were baked at 205° C. for 1 minute on a hot plate to form underlayer coatings (film thickness 0.22 μm). Then, dry etching rate on these underlayer coatings was measured with RIE system ES401 manufactured by Nippon Scientific Co., Ltd. under the condition in which $CF_4$ was used as dry etching gas. The results are shown in Table 2. The dry etching selectivity corresponds to dry etching rate of an underlayer coating in case where the dry etching rate of the photoresist for KrF laser lithography (manufactured by Shinetsu Chemical Co., Ltd., trade name: SEPR 430) is regarded as 1.00.

TABLE 1

| | Dry etching selectivity |
|---|---|
| Example 1 | 1.53 |
| Example 2 | 1.53 |
| Example 3 | 1.53 |
| Example 4 | 1.45 |
| Example 5 | 1.51 |
| Example 6 | 1.50 |
| Example 7 | 1.42 |
| Example 8 | 1.25 |

It was confirmed that the etching rate of the underlayer coatings obtained from the underlayer coating forming composition for lithography according to the present invention was higher that of the photoresists. An underlayer coating is required to have a higher dry etching rate than a photoresist owing to the following reasons: in the process in which the base of the substrate is exposed after development of the photoresist formed on the underlayer coating, the developed photoresist pattern can be transferred to a substrate accurately because the underlayer coating is removed before the photoresist is scraped out as the underlayer coating has a higher dry etching rate than the photoresist.

The invention claimed is:

1. An underlayer coating forming composition for lithography comprising a compound having a protected carboxyl group of formula (1):

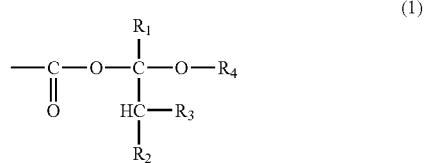

wherein $R_1$, $R_2$ and $R_3$ are independently of one another, hydrogen atom or $C_{1-10}$alkyl group, $R_4$ is $C_{1-10}$alkyl group, or $R_3$ and $R_4$ together may form a ring, a compound having a group capable of reacting with a carboxyl group, and a solvent.

2. An underlayer coating forming composition for lithography comprising a compound having a group capable of reacting with a carboxyl group, and a protected carboxyl group of formula (1) wherein $R_1$, $R_2$, $R_3$ and $R_4$ have the same meaning as that defined in claim 1, and a solvent.

3. The underlayer coating forming composition for lithography according to claim 1, wherein the group capable of reacting with a carboxyl group is a group selected from the group consisting of an epoxy group, an oxetanyl group, an oxazoline group, a cyclocarbonate group, an alkoxysilyl group, an aminomethylol group, an aziridinyl group, a methylol group, a hydroxy group, an isocyanate group, an alkoxymethylamino group, and a hydroxysilyl group.

4. The underlayer coating forming composition for lithography according to claim 1, wherein the compound having the protected carboxyl group of formula (1) is a polymer containing a unit structure of formula (2):

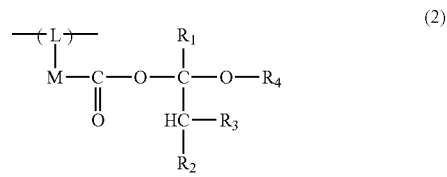

wherein L is a bonding group constituting a main chain of the polymer, and M is a direct bond or a linking group.

5. The underlayer coating forming composition for lithography according to claim 1, wherein the compound having a protected carboxyl group of formula (1) is a compound having at least two protected carboxyl groups of formula (1) and a molecular weight of 200 to 2000.

6. The underlayer coating forming composition for lithography according to claim 1, wherein the compound having a group capable of reacting with a carboxyl group is a compound having at least two groups of formula (3):

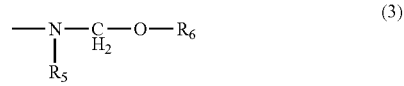

wherein $R_5$ is hydrogen atom, $C_{1-6}$alkyl group or —$CH_2OR_7$ wherein $R_7$ is hydrogen atom or $C_{1-10}$alkyl group, and $R_6$ is hydrogen atom or $C_{1-10}$alkyl group.

7. The underlayer coating forming composition for lithography according to claim 1, wherein the compound having a group capable of reacting with a carboxyl group is a polymer containing at least one unit structure selected from the group consisting of formulae (4), (5), (6), (7), (8) and (9):

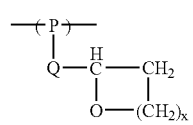

(4)

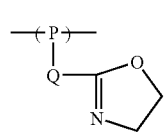

(5)

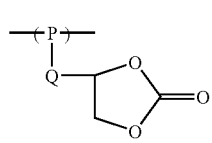

(6)

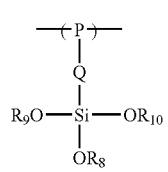

(7)

(8)

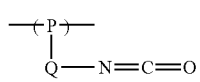

(9)

wherein P is a bonding group constituting a main chain of the polymer, Q is a direct bond or a linking group, $R_8$, $R_9$, $R_{10}$, and $R_{11}$ are independently of one another, hydrogen atom or $C_{1-6}$alkyl group, and x is 0 or 1.

8. The underlayer coating forming composition for lithography according to claim 2, wherein the compound having a group capable of reacting with a carboxyl group, and a protected carboxyl group of formula (1) is a polymer containing the unit structure of formula (2) and at least one unit structure selected from the group consisting of formulae (4), (5), (6), (7), (8) and (9).

9. The underlayer coating forming composition for lithography according to claim 2, wherein the compound having a group capable of reacting with a carboxyl group, and a protected carboxyl group of formula (1) is a polymer containing the unit structure of formulae (10) and (11):

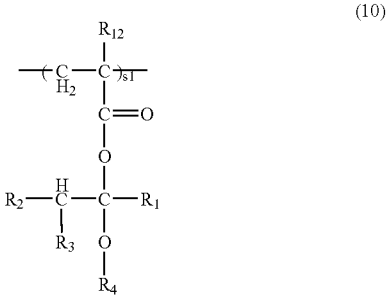

(10)

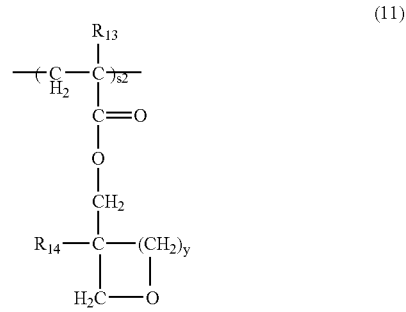

(11)

wherein $R_{12}$ and $R_{13}$ are independently of each other hydrogen atom or methyl group, $R_{14}$ is hydrogen atom, methyl group or ethyl group, y is 0 or 1, $s_1$ and $s_2$ are molar ratio of each unit structure constituting the polymer, $s_1$ is 0.05 to 0.95 and $s_2$ is 0.05 to 0.95, with proviso that $0.1 \leq s_1 + s_2 \leq 1$.

10. The underlayer coating forming composition for lithography according to claim 2, wherein the compound having a group capable of reacting with a carboxyl group, and a protected carboxyl group of formula (1) is a polymer containing the unit structure of formulae (12), (13) and (14):

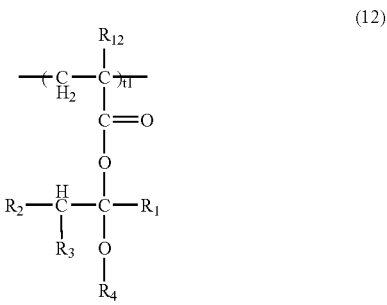

(12)

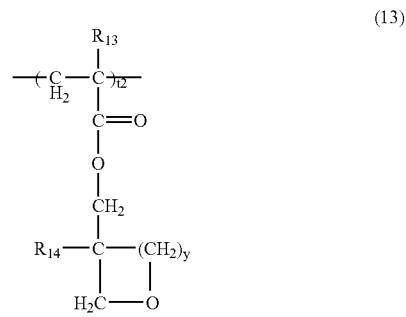

(13)

-continued

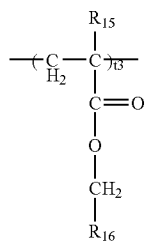

(14)

wherein $R_{12}$, $R_{13}$ and $R_{14}$ have the same meaning as that defined in claim 9, $R_5$ is hydrogen atom or methyl group, $R_{18}$ is hydrogen atom, $C_{1-6}$alkyl group, phenyl group, naphthyl group or anthryl group, $t_1$, $t_2$ and $t_3$ are molar ratio of each unit structure constituting the polymer, $t_1$ is 0.05 to 0.90, $t_2$ is 0.05 to 0.90 and $t_3$ is 0.05 to 0.90, with proviso that $0.15 \leq t_1 + t_2 + t_3 \leq 1$.

11. The underlayer coating forming composition for lithography according to claim 1, further comprising a light absorbing compound.

12. A method for forming an underlayer coating for use in manufacture of semiconductor device, comprising coating the underlayer coating forming composition for lithography according to claim 1 on a semiconductor substrate and baking it.

13. An underlayer coating obtained by coating the underlayer coating forming composition for lithography according to claim 1 on a semiconductor substrate and baking it.

14. A method for forming photoresist pattern for use in manufacture of semiconductor device, comprising coating the underlayer coating forming composition for lithography according to claim 1 on a semiconductor substrate, and baking it to form an underlayer coating, forming a photoresist layer on the underlayer coating, exposing the semiconductor substrate covered with the underlayer coating and the photoresist layer to light, and developing the photoresist layer after the exposure to light.

15. The method for forming photoresist pattern according to claim 14, wherein the exposure to light is carried out with a light of a wavelength of 248 nm, 193 nm or 157 nm.

* * * * *